(12) United States Patent
Zhang et al.

(10) Patent No.: US 12,295,139 B2
(45) Date of Patent: May 6, 2025

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 786 days.

(21) Appl. No.: 17/352,244

(22) Filed: Jun. 18, 2021

(65) Prior Publication Data

US 2022/0302151 A1 Sep. 22, 2022

Related U.S. Application Data

(63) Continuation of application No. PCT/CN2021/082026, filed on Mar. 22, 2021.

(51) Int. Cl.
*H10B 43/27* (2023.01)
*H10B 41/27* (2023.01)
(Continued)

(52) U.S. Cl.
CPC ............ *H10B 41/27* (2023.02); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ........ H10B 41/27; H10B 41/40; H10B 43/27; H10B 43/20; H10B 43/23; H10B 43/30; H10B 43/35
See application file for complete search history.

(56) References Cited

U.S. PATENT DOCUMENTS

| 8,779,499 B2 * | 7/2014 | Kiyotoshi | .............. | H10B 41/35 438/137 |
| 8,846,508 B1 | 9/2014 | England et al. | | |

(Continued)

FOREIGN PATENT DOCUMENTS

| CN | 107293544 A | 10/2017 |
| CN | 108886040 A | 11/2018 |

(Continued)

OTHER PUBLICATIONS

International Search Report issued in corresponding International Application No. PCT/CN2021/081997, mailed Dec. 28, 2021, 4 pages.

(Continued)

*Primary Examiner* — Eduardo A Rodela
(74) *Attorney, Agent, or Firm* — BAYES PLLC

(57) ABSTRACT

Three-dimensional (3D) memory devices and methods for forming the same are disclosed. In certain aspects, a 3D memory device includes a stack structure including interleaved conductive layers and dielectric layers, a doped semiconductor layer, and a channel structure extending through the stack structure and in contact with the doped semiconductor layer. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, one of the conductive layers that is closest to the doped semiconductor layer.

16 Claims, 23 Drawing Sheets

(51) Int. Cl.
  *H10B 41/35* (2023.01)
  *H10B 41/40* (2023.01)
  *H10B 43/35* (2023.01)
  *H10B 43/40* (2023.01)

(56) References Cited

U.S. PATENT DOCUMENTS

| | | | |
|---|---|---|---|
| 9,129,857 | B2 | 9/2015 | Kim et al. |
| 9,406,693 | B1* | 8/2016 | Pang ................ H01L 29/66833 |
| 9,805,805 | B1 | 10/2017 | Zhang et al. |
| 9,824,966 | B1 | 11/2017 | Kanakamedala et al. |
| 9,922,992 | B1* | 3/2018 | Yu ...................... H01L 29/0649 |
| 9,972,641 | B1 | 5/2018 | Zhang et al. |
| 10,199,359 | B1 | 2/2019 | Sakakibara et al. |
| 10,367,000 | B2* | 7/2019 | Fukushima ............ H10B 43/35 |
| 10,553,599 | B1 | 2/2020 | Chen et al. |
| 10,629,613 | B1 | 4/2020 | Shimizu et al. |
| 10,720,445 | B1 | 7/2020 | Shimizu et al. |
| 10,748,927 | B1* | 8/2020 | Tsutsumi ............... H10B 41/41 |
| 10,903,228 | B2* | 1/2021 | Sasaki .................... G11C 5/025 |
| 11,069,707 | B2* | 7/2021 | Tanabe .................. H01L 23/528 |
| 11,211,403 | B2* | 12/2021 | Lim ........................ H01L 28/60 |
| 11,348,910 | B2* | 5/2022 | Kim ........................ H10B 43/40 |
| 11,482,531 | B2* | 10/2022 | Said ..................... H01L 29/788 |
| 11,552,000 | B2* | 1/2023 | Yoshimizu ........ H01L 21/76805 |
| 11,594,544 | B2* | 2/2023 | Ryu ........................ H10B 43/35 |
| 11,605,644 | B2* | 3/2023 | Xiao ................. H01L 29/66833 |
| 2010/0309729 | A1 | 12/2010 | Chang et al. |
| 2013/0032878 | A1 | 2/2013 | Kim et al. |
| 2013/0168757 | A1 | 7/2013 | Hong |
| 2014/0126291 | A1 | 5/2014 | Mihnea et al. |
| 2015/0102399 | A1 | 4/2015 | Sakuma et al. |
| 2015/0179660 | A1 | 6/2015 | Yada et al. |
| 2015/0200259 | A1 | 7/2015 | Lim et al. |
| 2016/0204122 | A1 | 7/2016 | Shoji et al. |
| 2016/0307915 | A1 | 10/2016 | Pang et al. |
| 2017/0148811 | A1 | 5/2017 | Zhang et al. |
| 2017/0373078 | A1 | 12/2017 | Chu et al. |
| 2018/0102375 | A1 | 4/2018 | Pang et al. |
| 2018/0308559 | A1 | 10/2018 | Kim et al. |
| 2018/0358377 | A1 | 12/2018 | Carlson et al. |
| 2018/0374866 | A1 | 12/2018 | Makala et al. |
| 2019/0006381 | A1 | 1/2019 | Nakatsuji et al. |
| 2019/0088589 | A1 | 3/2019 | Zhu et al. |
| 2019/0123054 | A1 | 4/2019 | Chen et al. |
| 2019/0273088 | A1 | 9/2019 | Cui et al. |
| 2019/0371816 | A1 | 12/2019 | Huang et al. |
| 2020/0098787 | A1 | 3/2020 | Kaneko |
| 2020/0144285 | A1 | 5/2020 | Lee et al. |
| 2020/0243555 | A1 | 7/2020 | Hu et al. |
| 2020/0258816 | A1 | 8/2020 | Okina et al. |
| 2020/0312868 | A1 | 10/2020 | Xiao |
| 2020/0381446 | A1 | 12/2020 | Choi et al. |
| 2020/0411543 | A1 | 12/2020 | Wang et al. |
| 2021/0005621 | A1 | 1/2021 | Hu et al. |
| 2021/0006333 | A1 | 1/2021 | Morton et al. |
| 2021/0028190 | A1 | 1/2021 | Kim et al. |
| 2021/0057432 | A1 | 2/2021 | Lu et al. |
| 2021/0066458 | A1 | 3/2021 | Tak et al. |
| 2021/0399018 | A1 | 12/2021 | Zhu |
| 2022/0037352 | A1 | 2/2022 | Zhang et al. |
| 2022/0045090 | A1 | 2/2022 | Cui et al. |
| 2022/0262805 | A1 | 8/2022 | Tomita et al. |
| 2022/0302149 | A1 | 9/2022 | Zhang et al. |
| 2022/0302151 | A1 | 9/2022 | Zhang et al. |

FOREIGN PATENT DOCUMENTS

| | | |
|---|---|---|
| CN | 109219885 A | 1/2019 |
| CN | 109473445 A | 3/2019 |
| CN | 109755254 A | 5/2019 |
| CN | 110088903 A | 8/2019 |
| CN | 110310957 A | 10/2019 |
| CN | 110402495 A | 11/2019 |
| CN | 110785851 A | 2/2020 |
| CN | 110800106 A | 2/2020 |
| CN | 110970441 A | 4/2020 |
| CN | 111149206 A | 5/2020 |
| CN | 111162089 A | 5/2020 |
| CN | 111354730 A | 6/2020 |
| CN | 111370423 A | 7/2020 |
| CN | 111566816 A | 8/2020 |
| CN | 111755453 A | 10/2020 |
| CN | 111758164 A | 10/2020 |
| CN | 111799265 A | 10/2020 |
| CN | 111801797 A | 10/2020 |
| CN | 111801798 A | 10/2020 |
| CN | 111801799 A | 10/2020 |
| CN | 111801800 A | 10/2020 |
| CN | 112018126 A | 10/2020 |
| CN | 111937148 A | 11/2020 |
| CN | 112074956 A | 12/2020 |
| CN | 112397523 A | 2/2021 |
| CN | 112424933 A | 2/2021 |
| JP | 2010199314 A | 9/2010 |
| JP | 2019165135 A | 9/2019 |
| JP | 2020145233 A | 9/2020 |
| JP | 2021034696 A | 3/2021 |
| KR | 20130037063 A | 4/2013 |
| KR | 20150085735 A | 7/2015 |
| KR | 30270093099 A | 8/2017 |
| KR | 20200011498 A | 2/2020 |
| TW | 201601362 A | 1/2016 |
| TW | I582908 B | 5/2017 |
| TW | 201911537 A | 3/2019 |
| TW | 201913958 A | 4/2019 |
| TW | 201913966 A | 4/2019 |
| TW | 202025463 A | 7/2020 |
| TW | 202032769 A | 9/2020 |
| TW | 202034513 A | 9/2020 |
| TW | I705557 B | 9/2020 |
| TW | 202101668 A | 1/2021 |
| WO | 2016/093947 A1 | 6/2016 |
| WO | 2019104896 A1 | 6/2019 |
| WO | 2021237492 A1 | 12/2021 |

OTHER PUBLICATIONS

International Search Report issued in corresponding International Application No. PCT/CN2021/082028, mailed Dec. 22, 2021, 4 pages.

International Search Report issued in corresponding International Application No. PCT/CN2021/082026, mailed Dec. 27, 2021, 4 pages.

Extended European Search Report issued in corresponding European U.S. Appl. No. 21/932,003, mailed on Jul. 25, 2024, 8 pages.

Extended European Search Report issued in corresponding European Application No. 21931994, mailed on May 8, 2024, 12 pages.

International Search Report issued in corresponding International Application No. PCT/CN2020/092506, mailed Feb. 26, 2021, 6 pages.

Supplementary European Search Report issued in corresponding European Application No. 21932004.1, dated Oct. 29, 2024.

* cited by examiner

THREE-DIMENSIONAL MEMORY DEVICES AND METHODS FOR FORMING THE SAME

CROSS-REFERENCE TO RELATED APPLICATIONS

This application is a continuation of International Application No. PCT/CN2021/082026, filed on Mar. 22, 2021, entitled "THREE-DIMENSIONAL MEMORY DEVICES AND METHODS FOR FORMING THE SAME," which is hereby incorporated by reference in its entirety. This application is also related to U.S. application Ser. No. 17/352,242, filed on Jun. 18, 2021, entitled "THREE-DIMENSIONAL MEMORY DEVICES AND METHODS FOR FORMING THE SAME," and U.S. application Ser. No. 17/352,239, filed on Jun. 18, 2021, entitled "THREE-DIMENSIONAL MEMORY DEVICES AND METHODS FOR FORMING THE SAME," all of which are hereby incorporated by reference in their entireties.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes a stack structure including interleaved conductive layers and dielectric layers, a doped semiconductor layer, and a channel structure extending through the stack structure and in contact with the doped semiconductor layer. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, one of the conductive layers that is closest to the doped semiconductor layer.

In another aspect, a 3D memory device includes a stack structure including interleaved conductive layers and dielectric layers, and a channel structure extending through the stack structure. The conductive layers include one or more source select gate lines and a plurality of word lines. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, the one or more source select gate lines. The semiconductor channel includes a doped portion. A part of the doped portion faces, along the first direction, the one or more source select gate lines.

In still another aspect, a system includes a 3D memory device configured to store data and a controller circuit coupled to the 3D memory device. The 3D memory device includes a stack structure including interleaved conductive layers and dielectric layers, and a channel structure extending through the stack structure. The conductive layers include one or more source select gate lines and a plurality of word lines. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, the one or more source select gate lines. The semiconductor channel includes a doped portion. A part of the doped portion faces, along the first direction, the one or more source select gate lines. The controller circuit is configured to operate the composite dielectric film via the conductive layers.

In yet another aspect, a method for forming a 3D memory device is provided. A filling layer is formed above a substrate. A stack structure is formed above the filling layer. A channel structure extending through and beyond the stack structure and the filling layer is formed. The channel structure includes a first dielectric layer, a second dielectric layer, a third dielectric layer, and a semiconductor channel. The substrate and a part of the channel structure extending beyond the filling layer are sequentially removed to expose a part of the channel structure. A part of the second dielectric layer of the channel structure is replaced with a fourth dielectric layer including a dielectric material different from the second dielectric layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
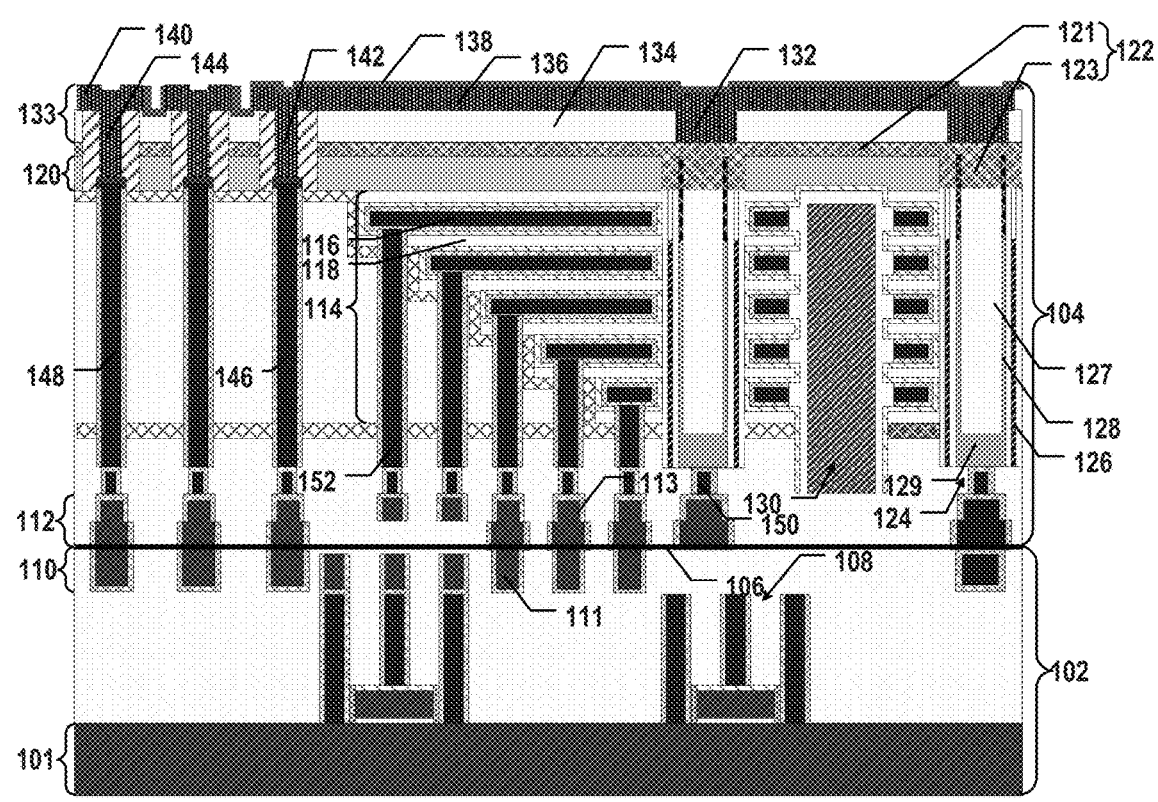
FIG. 1A illustrates a side view of a cross-section of an exemplary 3D memory device, according to some aspects of the present disclosure.
Figure 1A:
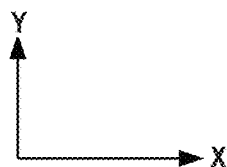

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D NAND memory devices, a semiconductor layer is selectively grown to surround the sidewalls of channel structures, e.g., known as sidewall selective epitaxial growth (SEG). Compared with another type of semiconductor layer that is epitaxial growth at the source end of the channel structures, e.g., bottom SEG, the formation of sidewall SEG avoids the etching of the memory film and the semiconductor channel at the bottom surface of channel holes (a.k.a. SONO punch), thereby increasing the process window, in particular when fabricating 3D NAND memory devices with advanced technologies, such as having 90 or more levels with a multi-deck architecture.

However, because intrinsic (pure, undoped) semiconductor materials, such as intrinsic polysilicon, are used to form the semiconductor channel, a relatively high potential barrier exists between the semiconductor channel and the sidewall SEG or the conductive layer in contact with the semiconductor channel, thereby introducing high contact resistance therebetween. The electric performance of the 3D memory device can be affected by the high contact resistance.

Moreover, the NAND memory string of 3D NAND memory devices includes a source select gate (SSG) transistor at the source end, which uses a portion of the memory film of the channel structure close to the source end as the gate dielectric. However, as the memory film is usually a composite dielectric film having different dielectric materials, such as silicon nitride in the storage layer, the performance of the SSG transistor may be affected by the composite gate dielectric film.

To address the aforementioned issues, the present disclosure introduces a solution in which the contact resistance between the semiconductor channel and the sidewall SEG or the conductive layer can be reduced, and the SSG transistor performance can be improved. In some implementations, the semiconductor channel is partially doped, such that part of the semiconductor channel that forms the source contact is highly doped to lower the potential barrier while leaving another part of the semiconductor channel that forms the memory cells remaining undoped or lowly doped. In some implementations, one end of each channel structure is opened from the backside to expose the doped part of the respective semiconductor channel, and the 3D memory device further includes a doped semiconductor layer electrically connecting the exposed doped parts of the semiconductor channels to further reduce the contact resistance and sheet resistance. For example, the doped semiconductor layer may include a plug extending the channel structure by replacing parts of the composite dielectric film and capping layer of the channel structure to increase the contact area and further reduce contact resistance. As a result, the electric performance of the 3D memory devices can be improved.

Moreover, consistent with the scope of the present disclosure, a portion of the composite dielectric film of the channel structure that faces the SSG line can become the gate dielectric portion that has the same dielectric material, such as silicon oxide, thereby improving the performance of the corresponding SSG transistor. In some implementations, part of the composite dielectric film having silicon nitride is replaced with silicon oxide from the backside during the fabrication process to form the gate dielectric portion of the composite dielectric film.

FIG. 1A illustrates a side view of a cross-section of an exemplary 3D memory device 100, according to some aspects of the present disclosure. In some implementations, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some implementations. As shown in FIG. 1A, first semiconductor structure 102 can include a substrate 101, which can include silicon (e.g., single crystalline silicon, c-Si), silicon germanium (SiGe), gallium arsenide (GaAs), germanium (Ge), silicon-on-insulator (SOI), or any other suitable materials.

First semiconductor structure 102 of 3D memory device 100 can include peripheral circuits 108 on substrate 101. It is noted that x and y axes are included in FIG. 1A to further illustrate the spatial relationship of the components in 3D memory device 100 having substrate 101. Substrate 101 includes two lateral surfaces (e.g., a top surface and a bottom surface) extending laterally in the x-direction (i.e., the lateral direction). As used herein, whether one component (e.g., a layer or a device) is on, above, or below another component (e.g., a layer or a device) of a semiconductor device (e.g., 3D memory device 100) is determined relative to the substrate of the semiconductor device (e.g., substrate 101) in the y-direction (i.e., the vertical direction) when the substrate is positioned in the lowest plane of the semiconductor device in they-direction. The same notion for describing spatial relationships is applied throughout the present disclosure.

In some implementations, peripheral circuit 108 is configured to control and sense 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuit 108 can include transistors formed on substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral circuit 108 may further include any other circuits compatible with the advanced logic processes including logic circuits, such as processors and programmable logic devices (PLDs), or memory circuits, such as static random-access memory (SRAM) and dynamic RAM (DRAM).

In some implementations, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. The interconnect layer can further include one or more interlayer dielectric (ILD) layers (a.k.a. intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some implementations.

As described below in detail, second semiconductor structure 104 can be bonded on top of first semiconductor structure 102 in a face-to-face manner at bonding interface 106. In some implementations, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some implementations, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some implementations, 3D memory device 100 is a NAND Flash memory device in which memory cells are provided in the form of an array of NAND memory strings. Each NAND memory string can include a respective channel structure 124. As shown in FIG. 1A, each channel structure 124 can extend vertically through a plurality of pairs each including a stack conductive layer 116 and a stack dielectric layer 118. The interleaved stack conductive layers 116 and stack dielectric layers 118 are part of a memory stack 114. The number of the pairs of stack conductive layers 116 and stack dielectric layers 118 in memory stack 114 determines the number of memory cells in 3D memory device 100. It is understood that in some implementations, memory stack 114 may have a multi-deck architecture (not shown), which includes a plurality of memory decks stacked over one another. The numbers of the pairs of stack conductive layers 116 and stack dielectric layers 118 in each memory deck can be the same or different.

Memory stack 114 can include a plurality of interleaved stack conductive layers 116 and stack dielectric layers 118. Stack conductive layers 116 and stack dielectric layers 118 in memory stack 114 can alternate in the vertical direction. In other words, except the ones at the top or bottom of memory stack 114, each stack conductive layer 116 can be adjoined by two stack dielectric layers 118 on both sides, and each stack dielectric layer 118 can be adjoined by two stack conductive layers 116 on both sides. Stack conductive layers 116 can include conductive materials including, but not limited to, W, Co, Cu, Al, polysilicon, doped silicon, silicides, or any combination thereof. Each stack conductive layer 116 can include a gate electrode (gate line) surrounded by an adhesive layer and a gate dielectric layer. The gate electrode of stack conductive layer 116 can extend laterally as a word line, ending at one or more staircase structures of memory stack 114. Stack dielectric layers 118 can include dielectric materials including, but not limited to, silicon oxide, silicon nitride, silicon oxynitride, or any combination thereof.

As shown in FIG. 1A, second semiconductor structure 104 of 3D memory device 100 can also include a filling layer 120 above memory stack 114. Filling layer 120 can include polysilicon, a high dielectric constant (high-k) dielectric, or a metal. For example, a high-k dielectric may include any dielectric materials having a dielectric constant higher than that of silicon oxide (e.g., k>3.7). Different from some known solutions in which filling layer 120 acts as the sidewall SEGs surrounding channel structures 124 and/or a conductive layer electrically connecting channel structures 124, such as a doped polysilicon layer, filling layer 120 in second semiconductor structure 104 of 3D memory device 100 may not work as the sidewall SEGs and/or the conductive layer and thus, may include materials other than doped polysilicon, such as dielectrics (e.g., high-k dielectrics), metals (e.g., W, Co, Cu, or Al), metal silicides, or undoped polysilicon. It is understood that in some examples, filling layer 120 may include doped polysilicon as well.

In some implementations, each channel structure 124 includes a channel hole filled with a semiconductor channel 128 and a composite dielectric film 126. As shown in FIG. 1A, the remaining space of the channel hole can be partially filled with a capping layer 127 including dielectric materials, such as silicon oxide, and/or an air gap (not shown). Channel structure 124 can have a cylinder shape (e.g., a pillar shape). Capping layer 127, semiconductor channel 128, and composite dielectric film 126 are arranged radially from the center toward the outer surface of the pillar in this order, according to some implementations. Composite dielectric film 126 can radially circumscribes semiconductor channel 128 along the lateral direction (e.g., the x-direction in FIG. 1A). Composite dielectric film 126 can be formed laterally between semiconductor channel 128 and stack conductive layers 116 and stack dielectric layers 118. Each channel structure 124 can extend vertically through interleaved stack conductive layers 116 and stack dielectric layers 118 of memory stack 114 and in contact with filling layer 120. That is, channel structure 124 can extend through memory stack 114 in the positive y-direction. The upper end of composite dielectric film 126 is flush with the interface between filling layer 120 and memory stack 114, i.e., the bottom surface of filling layer 120 and the top surface of memory stack 114, according to some implementation.

In some implementations, semiconductor channel 128 includes silicon, such as amorphous silicon, polysilicon, or single crystalline silicon. Also referred to the enlarged side view of channel structure 124 in FIG. 2A, semiconductor channel 128 can include a doped portion 128a and an undoped portion 128b. As described below with respect to the fabrication process, from the fabrication process perspective, in some implementations, part of doped portion 128a of semiconductor channel 128 extends beyond memory stack 114 in a first direction (e.g., the positive y-direction in FIG. 2A). That is, the upper end of doped portion 128a can be above the interface between filling layer 120 and memory stack 114, i.e., the bottom surface of filling layer 120 and the top surface of memory stack 114. As described below with respect to a plug 123 of a doped semiconductor layer 122, the part of doped portion 128a that extends beyond memory stack 114 can extend into plug 123. That is, the extended part of doped portion 128a can be embedded into plug 123 and surrounded by plug 123 radially, as shown in the top plan view of a cross-section through plug 123 in FIG. 2A. In some implementations, plug 123 can have the same material with the same type of dopant and doping profile as the extended part of doped portion 128a. As a result, it is understood that the interface and boundary between the extended part of doped portion 128a of semiconductor channel 128 and plug 123 of doped semiconductor layer 122 may become indistinguishable and thus cannot be discerned in 3D memory device 100. In other words, from the structure perspective, the extended part of doped portion 128a into plug 123 can also be considered as not part of semiconductor channel 128, and doped portion 128a of semiconductor channel 128 may not extend beyond memory stack 114 in the vertical direction. Instead, the upper ends of semiconductor channel 128 and composite dielectric film 126 may be flush with the interface between filling layer 120 and memory stack 114, i.e., the bottom surface of filling layer 120 and the top surface of memory stack 114. That is, the upper end of channel structure 124 may be in contact with plug 123 of doped semiconductor channel at the interface between filling layer 120 and memory stack 114.

Figure 2A:
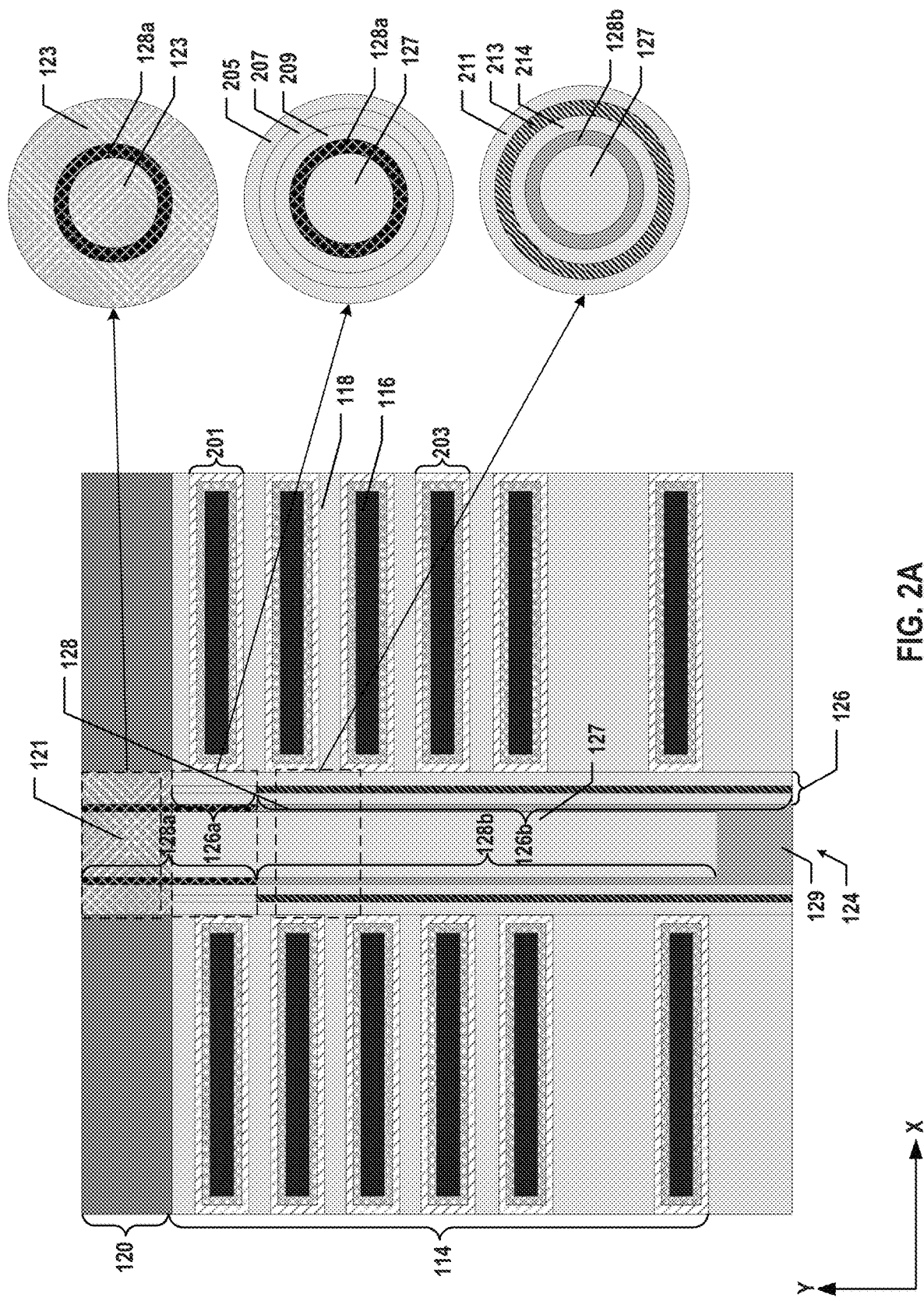
FIG. 2A illustrates an enlarged side view of a cross-section of an exemplary channel structure in the 3D memory device in FIG. 1A, according to some aspects of the present disclosure.

In some implementations, doped portion 128a of semiconductor channel 128 extends beyond one of stack conductive layers 116 in a direction opposite to the first direction (e.g., the negative y-direction in FIG. 2A). It is understood that one or more of stack conductive layers 116 that are close to filling layer 120 may be source select gate line 201 (SSG line, sometimes referred to as bottom select gate (BSG) line), and the rest of stack conductive layer 116 may include word lines 203. Doped portion 128a of semiconductor channel 128 also extends beyond a source select gate line 201 that is closest to filling layer 120, according to some implementations. It is understood that if second semiconductor structure 104 of 3D memory device 100 includes more than one source select gate line 201, doped portion 128a may extend beyond all source select gate lines 201. On the other hand, doped portion 128a may not extend further to face word lines 203 along a second direction (e.g., the x-direction in FIG. 2A) perpendicular to the first direction. That is, the lower end of doped portion 128a is between source select gate lines 201 and word lines 203 in the vertical direction, according to some implementations.

In some implementations, doped portion 128a of semiconductor channel 128 includes N-type doped polysilicon. The dopant can be any suitable N-type dopants, such as phosphorus (P), arsenic (Ar), or antimony (Sb), which contribute free electrons and increase the conductivity of the intrinsic semiconductor. In some implementations, the doping concentration of doped portion 128a is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values). The doping concentrations of doped portion 128a disclosed herein can significantly reduce the contact resistance between semiconductor channel 128 and a doped semiconductor layer 122 compared with intrinsic semiconductors. It is understood that in some examples, the diffusion of the dopant may be confined in doped portion 128a of semiconductor channel 128, such that the rest of semiconductor channel 128, i.e., the part that faces word lines 203, is undoped portion 128b that still includes intrinsic semiconductor, such as intrinsic polysilicon (i.e., the doping concentration is nominally zero). The doping concentration profile described above can reduce the potential barrier, the contact resistance, and the sheet resistance at doped portion 128a of semiconductor channel 128, which makes electrical connections for the source of the corresponding NAND memory string, without altering the intrinsic nature of undoped portion 128b of semiconductor channel 128 that forms the memory cells of the NAND memory string.

As shown in FIG. 2A, in some implementations, composite dielectric film 126 includes a gate dielectric portion 126a and a memory portion 126b along the vertical direction (e.g., the y-direction in FIG. 2A). Gate dielectric portion 126a and memory portion 126b can be in contact with one another in the vertical direction. Similar to doped portion 128a of semiconductor channel 128, gate dielectric portion 126a of composite dielectric film 126 can extend beyond one of stack conductive layers 116 in the vertical direction (e.g., the negative y-direction in FIG. 2A). That is, in some implementations, gate dielectric portion 126a of composite dielectric film 126 also extends beyond source select gate line 201 that is closest to filling layer 120. It is understood that if second semiconductor structure 104 of 3D memory device 100 includes more than one source select gate line 201, gate dielectric portion 126a may extend beyond all source select gate lines 201. In other words, part of gate dielectric portion 126a of composite dielectric film 126 faces, along the lateral direction (e.g., the x-direction in FIG. 2A), at least one of stack conductive layers 116 that is closest to doped semiconductor layer 122, for example, one or more source select gate lines 201. Similar to undoped portion 128b of semiconductor channel 128, memory portion 126b of composite dielectric film 126 can face word lines 203 along the lateral direction (e.g., the x-direction in FIG. 2A).

As shown in the bottom plan view of a cross-section through memory portion 126b of composite dielectric film 126 in FIG. 2A, memory portion 126b can include a tunneling layer 214, a storage layer 213 (also known as a "charge trap layer"), and a blocking layer 211 stacking along the lateral direction (e.g., the x-direction in FIG. 2A). Capping layer 127, semiconductor channel 128 (e.g., undoped portion 128b), tunneling layer 214, storage layer 213, and blocking layer 211 of memory portion 126b are arranged radially from the center toward the outer surface of the pillar in this order, according to some implementations. Tunneling layer 214 can include silicon oxide, silicon oxynitride, or any combination thereof. Storage layer 213 can include silicon nitride, silicon oxynitride, silicon, or any combination thereof. Blocking layer 211 can include silicon oxide, silicon oxynitride, high-k dielectrics, or any combination thereof. In one example, memory portion 126b of composite dielectric film 126 of can include a composite layer of silicon oxide/silicon nitride/silicon oxide (ONO). In other words, tunneling layer 214, storage layer 213, and blocking layer 211 may include silicon oxide, silicon nitride, and silicon oxide, respectively.

As shown in the middle plan view of a cross-section through gate dielectric portion 126a of composite dielectric film 126 in FIG. 2A, gate dielectric portion 126a can include a first gate dielectric layer 205, a second gate dielectric layer 207, and a third gate dielectric layer 209 stacking along the lateral direction (e.g., the x-direction in FIG. 2A). Capping layer 127, semiconductor channel 128 (e.g., doped portion 128a), third gate dielectric layer 209, second gate dielectric layer 207, and first gate dielectric layer 205 of gate dielectric portion 126a are arranged radially from the center toward the outer surface of the pillar in this order, according to some implementations. In some implementations, first, second, and third gate dielectric layers 205, 207, and 209 include a same dielectric material, such as silicon oxide. In this case, it is understood that the interfaces and boundaries between first, second, and third gate dielectric layers 205, 207, and 209 may become indistinguishable and thus cannot be discerned in 3D memory device 100. In other words, gate dielectric portion 126a of composite dielectric film 126 may be considered having a single dielectric layer with the same dielectric material, such as silicon oxide.

First gate dielectric layer 205 can be in contact with blocking layer 211 in the vertical direction, second gate dielectric layer 207 can be in contact with storage layer 213 in the vertical direction, and third gate dielectric layer 209 can be in contact with tunneling layer 214 in the vertical direction. In some implementations, first gate dielectric layer 205 and blocking layer 211 include a same dielectric material, such as silicon oxide. In some implementations, third gate dielectric layer 209 and tunneling layer 214 include a same dielectric material, such as silicon oxide. For example, each of blocking layer 211, tunneling layer 214, and first and third gate dielectric layers 205 and 209 may include silicon oxide. In this case, it is understood that the interface and boundary between first gate dielectric layer 205 and blocking layer 211 as well as the interface and boundary between third gate dielectric layer 209 and tunneling layer 214 may become indistinguishable and thus cannot be discerned in 3D memory device 100. Conversely, in some implementations, second gate dielectric layer 207 and storage layer 213 have different dielectric materials. For example, storage layer 213 may include silicon nitride, while second gate dielectric layer 207 may include a dielectric material than other silicon nitride. In one example, second gate dielectric layer 207 may include silicon oxide.

By facing source select gate line(s) 201, gate dielectric portion 126a of composite dielectric film 126 can act as the gate dielectric of the SSG transistor of the NAND memory string corresponding to channel structure 124. Compared with memory portion 126b, which includes storage layer 213 having silicon nitride, gate dielectric portion 126a can have more uniform dielectric materials free of silicon nitride (e.g., only silicon oxide) to improve the performance of the SSG transistor. On the other hand, memory portion 126b of composite dielectric film 126 that faces word lines 203 can maintain its function as a memory film (including storage layer 213 having silicon nitride) of memory cells of the NAND memory string corresponding to channel structure 124. As described below with respect to the fabrication process, three dielectric layers stacking along the lateral direction can be formed first, and then the silicon nitride of the middle dielectric layer may be partially replaced with silicon oxide to form composite dielectric film 126 disclosed herein.

Figure 2B:
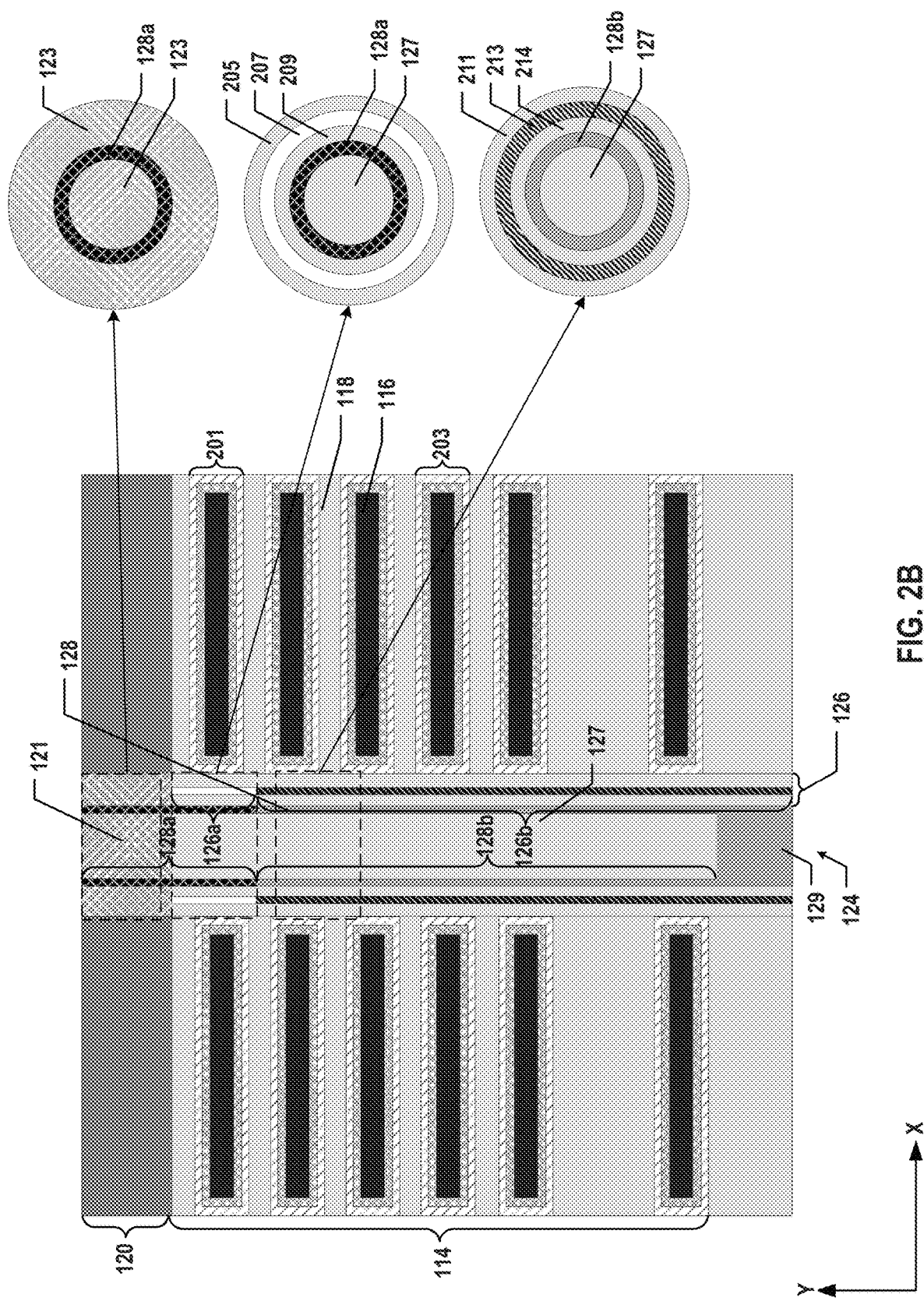
FIG. 2B illustrates an enlarged side view of a cross-section of another exemplary channel structure in the 3D memory device in FIG. 1A, according to some aspects of the present disclosure.

Consistent with the scope of the present disclosure, gate dielectric portion 126a of composite dielectric film 126 can include one or more air gaps (i.e., not being fully filled with dielectric material(s)), as shown in FIG. 2B. In some implementations, the entirety of second dielectric layer 207 of gate dielectric portion 126a is replaced with an air gap, as shown in FIG. 2B. It is understood that in some examples, only a portion of second dielectric layer 207 of gate dielectric portion 126a may be replaced with one or more air gaps. That is, second dielectric layer 207 of gate dielectric portion 126a can include air gap(s) in the dielectric material, such as silicon oxide. Although not shown, it is further understood that in some examples, first dielectric layer 205 and/or third dielectric layer 209 may be partially or fully filled with air gaps as well, like second dielectric layer 207 in FIG. 2B. As a result, in some implementations, gate dielectric portion 126a and memory portion 126b of composite dielectric film 126 may not be fully in contact with one another along the vertical direction, but rather with some space (e.g., air gaps) inbetween. In some implementations, the air gap(s) in gate dielectric portion 126a of composite dielectric film 126 are void(s) formed as a result of the fabrication variation or deficiency. In some implementations, the air gap(s) in gate dielectric portion 126a of composite dielectric film 126 are formed to avoid gate dielectric portion 126a from being broken-down due to a high voltage applied to the gate dielectric of the corresponding SSG transistor, for example, due to the gate-induced drain leakage (GIDL) effect in an erase operation.

In some implementations, channel structure 124 further includes a channel plug 129 in the bottom portion (e.g., at the lower end) of channel structure 124. As used herein, the upper end of a component (e.g., channel structure 124) is the end farther away from substrate 101 in the y-direction, and the lower end of the component (e.g., channel structure 124) is the end closer to substrate 101 in they-direction when substrate 101 is positioned in the lowest plane of 3D memory device 100. Channel plug 129 can include semiconductor materials (e.g., polysilicon). In some implementations, channel plug 129 functions as the drain of channel structure 124.

As shown in FIG. 1A, in some implementations, second semiconductor structure 104 of 3D memory device 100 includes doped semiconductor layer 122. Each channel structure 124 can extend through memory stack 114 in the vertical direction and be in contact with doped semiconductor layer 122. In some implementations, part of doped portion 128a of each semiconductor channel 128 extends beyond memory stack 114 in the vertical direction and is in contact with doped semiconductor layer 122, such that doped semiconductor layer 122 can electrically connect multiple channel structures 124 through their doped portions 128a of semiconductor channels 128. For example, doped semiconductor layer 122 may provide electrical connections between the sources of an array of NAND memory strings in the same block, i.e., the array common source (ACS), with or without filling layer 120 (depending on whether filling layer 120 is conductive or not). In other words, filling layer 120 may not have to include conductive materials, such as metals or doped polysilicon, as doped semiconductor layer 122 alone can electrically connect the sources of multiple NAND memory strings. As a result, the material and dimension constraints on filling layer 120 can be relaxed.

As shown in FIG. 1A, in some implementations, doped semiconductor layer 122 includes two portions: a plate 121 in contact with filling layer 120, and plugs 123 each extending from plate 121 into filling layer 120 and in contact with semiconductor channel 128 of channel structure 124. Plate 121 of doped semiconductor layer 122 is above and in contact with filling layer 120, according to some implementations. By extending laterally above multiple channel structures 124, plate 121 can connect multiple plugs 123, each of which is in contact with a respective channel structure 124. Also referred to FIG. 2A, doped portion 128a of semiconductor channel 128 extends into plug 123 of doped semiconductor layer 122, according to some implementations. As described below in detail with respect to the fabrication of 3D memory device 100, part of channel structure 124 can be removed to form a recess in filling layer 120 where plug 123 can be formed into. Also, plug 123 of doped semiconductor layer 122 can be in contact with gate dielectric portion 126a of composite dielectric film 126 and capping layer 127 in the vertical direction. As shown in FIG. 2A, in some implementations, plug 123 protrudes into filling layer 120, such that the lower end of plug 123 is flush with the interface between filling layer 120 and memory stack 114. That is, composite dielectric film 126 and capping layer 127 do not extend beyond memory stack 114 due to the existent of plug 123, according to some implementations.

As described below in detail, the formation of memory stack 114 and the formation of doped portion 128a of semiconductor channel 128 and doped semiconductor layer 122 can occur at opposite sides of filling layer 120, thereby avoiding any deposition or etching process through openings extending through memory stack 114, thereby reducing the fabrication complexity and cost and increasing the yield and vertical scalability.

Similar to doped portion 128a of semiconductor channel 128, in some implementations, doped semiconductor layer 122 (including plate 121 and plugs 123) also includes N-type doped polysilicon. The dopant can be any suitable N-type dopants, such as P, Ar, or Sb, which contribute free electrons and increase the conductivity of the intrinsic semiconductor. Similar to doped portion 128a of semiconductor channel 128, in some implementations, the doping concentration of doped semiconductor layer 122 is between about $10^{19}$ cm$^{-3}$ and about $10^{21}$ cm$^{-3}$, such as between $10^{19}$ cm$^{-3}$ and $10^{21}$ cm$^{-3}$ (e.g. $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values). The doping concentrations of doped semiconductor layer 122 disclosed herein can significantly reduce the contact resistance between semiconductor channel 128 and doped semiconductor channel 122 as well as the sheet resistance of doped semiconductor layer 122, compared with intrinsic semiconductors. As described below in detail, in some implementations, doped portion 128a of semiconductor channel 128 and doped semiconductor layer 122 have the same material (e.g., N-type doped polysilicon) with the same dopant as well as a continuous doping profile due to the same local activation process performed thereon. Thus, it is understood that the interface and boundary between doped portion 128a of semiconductor channel 128 and plug 123 of doped semiconductor layer 122 may become indistinguishable and thus cannot be discerned in 3D memory device 100.

By doping and contacting semiconductor channel 128 and doped semiconductor layer 122, the contact resistance between the NAND memory strings (i.e., at the ACS of NAND memory strings in the same block) can be reduced, thereby improving the electrical performance of 3D memory device 100. As shown in FIGS. 1A and 2, by extending plug 123 into filling layer 120, doped portion 128a of semiconductor channel 128 can be embedded in plug 123 of doped semiconductor layer 122, thereby increasing the contact area between semiconductor channel 128 and doped semiconductor layer 122, which further reduces the contact resistance therebetween. N-type doped semiconductor layer 122 can enable gate-induced drain leakage (GIDL)-assisted body biasing for erase operations for 3D memory device 100. The GIDL around source select gate line(s) 201 can generate hole current (i.e., source leakage current) into semiconductor channel 128 from the source of the corresponding NAND memory string to raise the body potential for erase operations. That is, N-type doped semiconductor layer 122 is configured to generate GIDL-assisted body biasing when performing an erase operation, according to some implementations. In some implementations, by also doping part of semiconductor channel 128 facing source select gate line(s) 201 as well as by replacing silicon nitride with silicon oxide in the portion of composite dielectric film 126 that faces source select gate line(s) 201, the GIDL effect can be further enhanced.

As shown in FIG. 1A, second semiconductor structure 104 of 3D memory device 100 can further include insulating structures 130 each extending vertically through interleaved stack conductive layers 116 and stack dielectric layers 118 of memory stack 114. Insulating structures 130 stops at the bottom surface of filling layer 120, i.e., does not extend vertically into filling layer 120, according to some implementations. That is, the top surface of insulating structure 130 can be flush with the bottom surface of filling layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. Different from the slit structures in existing 3D NAND memory devices, which include front side ACS contacts, insulating structure 130 does not include any contact therein (i.e., not functioning as the source contact) and thus, does not introduce parasitic capacitance and leakage current with stack conductive layers 116, according to some implementations. In some implementations, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide. It is understood that in some examples (as shown in FIG. 1A), insulating structure 130 may be partially filled with non-dielectric materials, such as polysilicon, to adjust the mechanical properties, e.g., the hardness and/or stress, of insulating structure 130.

Moreover, as described below in detail, because the opening for forming insulating structure 130 is not used for forming doped semiconductor layer 122 and doped portion 128a of semiconductor channel 128, the increased aspect ratio of the opening (e.g., greater than 50) as the number of interleaved stack conductive layers 116 and stack dielectric layers 118 increases would not affect the formation of doped semiconductor layer 122 and doped portion 128a of semiconductor channel 128.

Instead of the front side source contacts, 3D memory device 100 can include one or more backside source contacts 132 above and in contact with doped semiconductor layer 122, as shown in FIG. 1A. Source contact 132 and memory stack 114 (and insulating structure 130 therethrough) can be disposed at opposite sides of filling layer 120 and thus, viewed as a "backside" source contact. In some implementations, source contact 132 is electrically connected to semiconductor channel 128 of channel structure 124 through doped semiconductor layer 122. Source contacts 132 can include any suitable types of contacts. In some implementations, source contacts 132 include a VIA contact. In some implementations, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

Figure 3A:
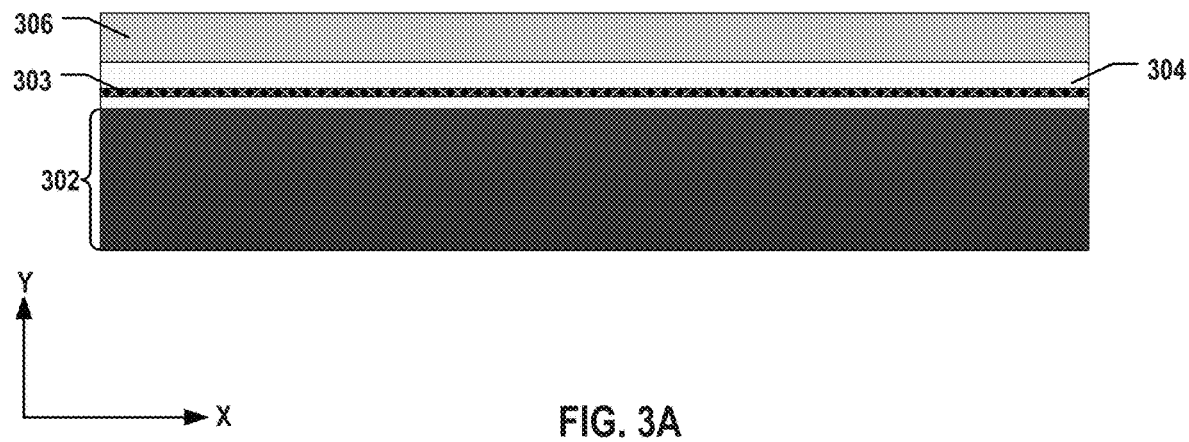
FIGS. 3A-3Q illustrate a fabrication process for forming an exemplary 3D memory device, according to some aspects of the present disclosure.
Figure 3B:
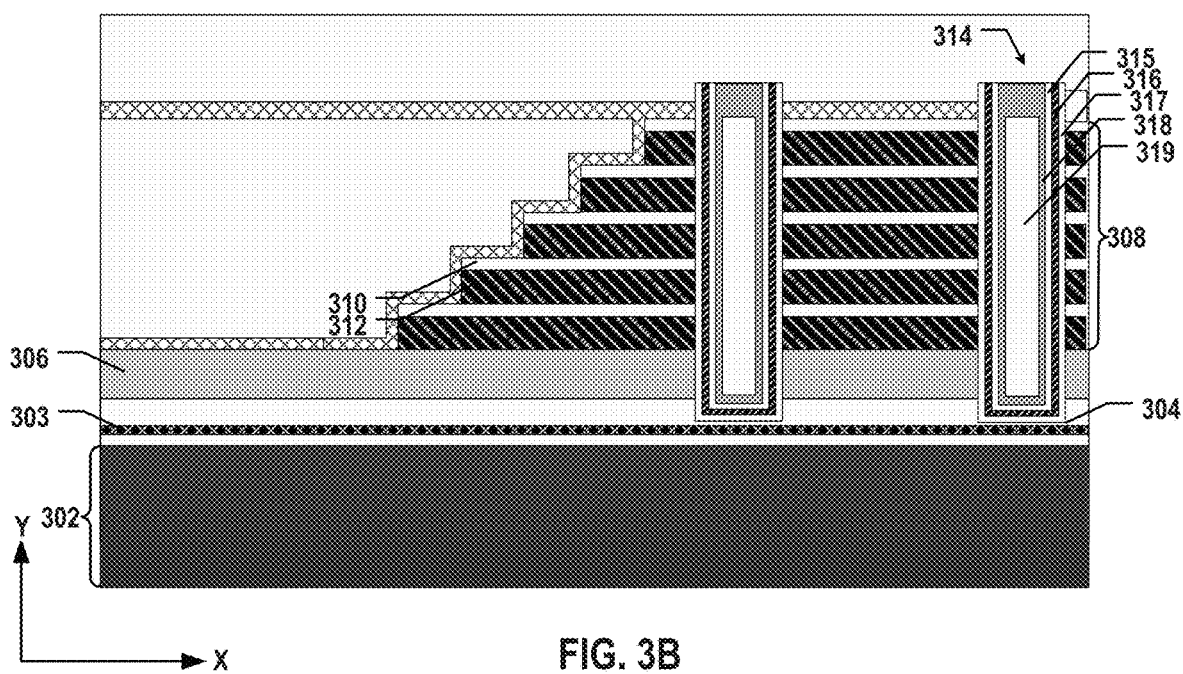
Figure 3C:
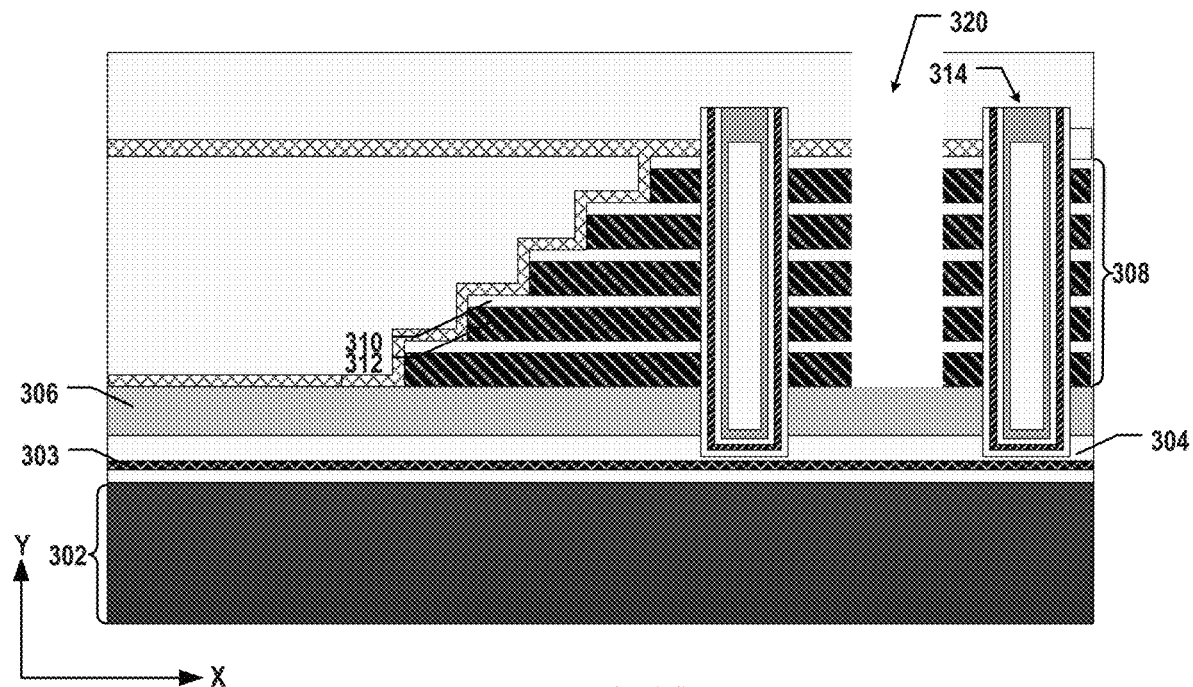
Figure 3D:
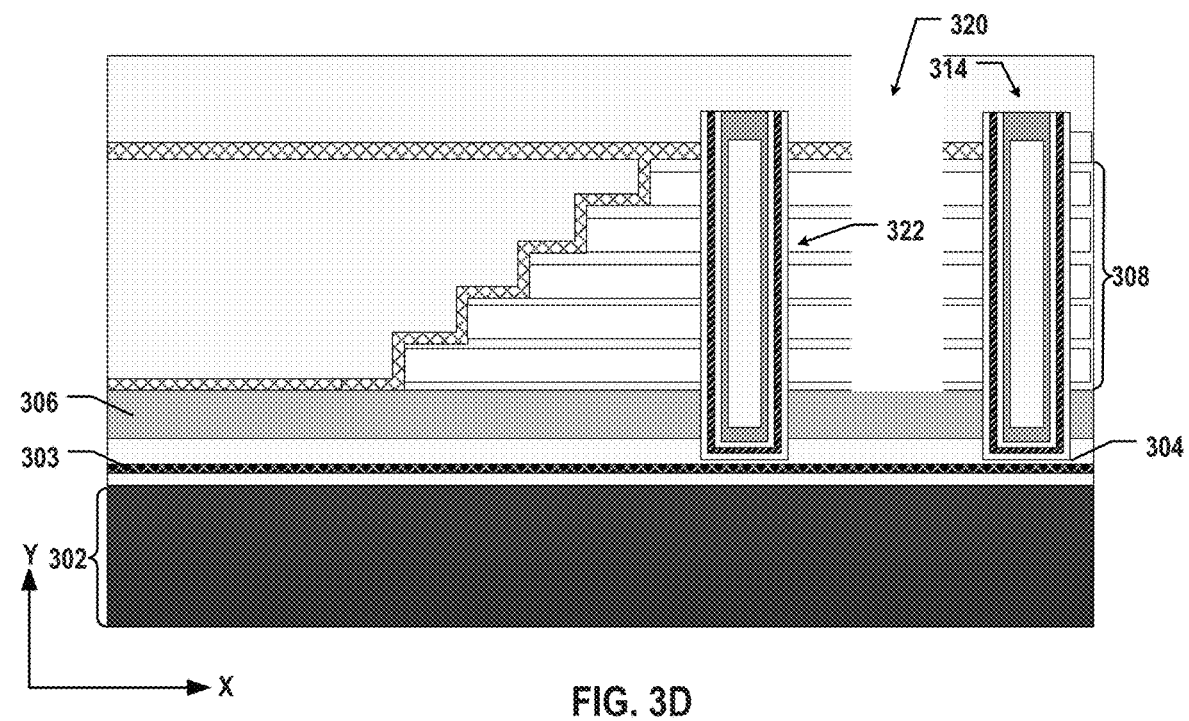

As shown in FIG. 1A, 3D memory device 100 can further include a BEOL interconnect layer 133 above and electrically connected to source contact 132 for pad-out, e.g., transferring electrical signals between 3D memory device 100 and external circuits. In some implementations, interconnect layer 133 includes one or more ILD layers 134 on doped semiconductor layer 122 and a redistribution layer 136 on ILD layers 134. The upper end of source contact 132 is flush with the top surface of ILD layers 134, and the bottom surface of redistribution layer 136, and source contact 132 extends vertically through ILD layers 134 to be in contact with doped semiconductor layer 122, according to some implementations. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to W, Co, Cu, Al, silicides, or any combination thereof. In some implementations, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer. As described below with respect to the fabrication process, in some implementations, source contacts 132 and redistribution layer 136 may be formed by the same process and have the same material, e.g., Al. Thus, source contacts 132 may be viewed as part of BEOL interconnect layer 133 as well in some examples.

In some implementations, second semiconductor structure 104 of 3D memory device 100 further includes contacts 142 and 144 through doped semiconductor layer 122 and filling layer 120. As doped semiconductor layer 122 can include polysilicon, contacts 142 and 144 are through silicon contacts (TSCs), according to some implementations. In some implementations, contact 142 extends through doped semiconductor layer 122, filling layer 120, and ILD layers 134 to be in contact with redistribution layer 136, such that doped semiconductor layer 122 is electrically connected to contact 142 through source contact 132 and redistribution layer 136 of interconnect layer 133. In some implementations, contact 144 extends through doped semiconductor layer 122, filling layer 120, and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some implementations, at least contact 144 further includes a spacer (e.g., a dielectric layer) to electrically separate contact 144 from doped semiconductor layer 122 and filling layer 120.

In some implementations, 3D memory device 100 further includes peripheral contacts 146 and 148 each extending vertically outside of memory stack 114. Each peripheral contact 146 or 148 can have a depth greater than the depth of memory stack 114 to extend vertically from bonding layer 112 to filling layer 120 in a peripheral region that is outside of memory stack 114. In some implementations, peripheral contact 146 is below and in contact with contact 142, such that doped semiconductor layer 122 is electrically connected to peripheral circuit 108 in first semiconductor structure 102 through at least source contact 132, redistribution layer 136, contact 142, and peripheral contact 146. In some implementations, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1A, 3D memory device 100 also includes a variety of local contacts (also known as "C1") as part of the interconnect structure, which are in contact with a structure in memory stack 114 directly. In some implementations, the local contacts include channel local contacts 150 each below and in contact with the lower end of respective channel structure 124. Each channel local contact 150 can be electrically connected to a bit line contact (not shown) for bit line fan-out. In some implementations, the local contacts further include word line local contacts 152 each below and in contact with respective stack conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Although an exemplary 3D memory device 100 is shown in FIG. 1A, it is understood that by varying the relative positions of first and second semiconductor structures 102 and 104, the usage of backside source contacts 132 or known front side source contacts (not shown), and/or the pad-out locations (e.g., through first semiconductor structure 102 and/or second semiconductor structure 104), any other suitable architectures of 3D memory devices may be applicable in the present disclosure without further detailed elaboration.

Figure 1B:
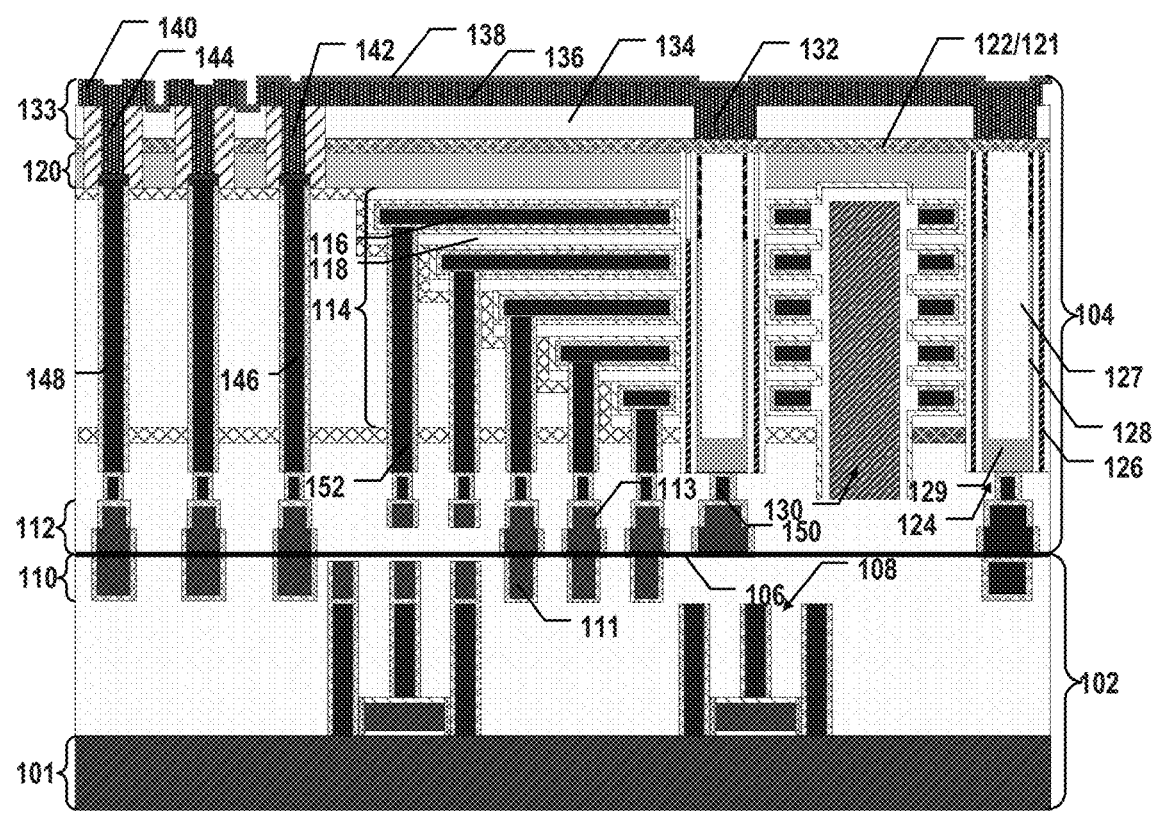
FIG. 1B illustrates a side view of a cross-section of another exemplary 3D memory device, according to some aspects of the present disclosure.

FIG. 1B illustrates a side view of a cross-section of another exemplary 3D memory device 160, according to some implementations of the present disclosure. 3D memory device 160 is similar to 3D memory device 100 except for the different structures of doped semiconductor layer 122 and the upper ends of composite dielectric film 126 and capping layer 127. It is understood that the details of other same structures in both 3D memory devices 160 and 100 are not repeated for ease of description.

As shown in FIG. 1B, doped semiconductor layer 122 does not include any plug (e.g., plug 123 in FIG. 1A) extending into filling layer 120, according to some implementations. That is, in some implementations, the entire doped semiconductor layer 122 may be viewed as plate 121. Without plug 123 extending into filling layer 120, channel structure 124 (including composite dielectric film 126 and capping layer 127) can extend beyond memory stack 114 in the vertical direction (e.g., the positive y-direction in FIG. 1B) and is in contact with doped semiconductor layer 122. That is, the upper ends of composite dielectric film 126, semiconductor channel 128, and capping layer 127 can be flush with one another and in contact with doped semiconductor layer 122.

Figure 7:
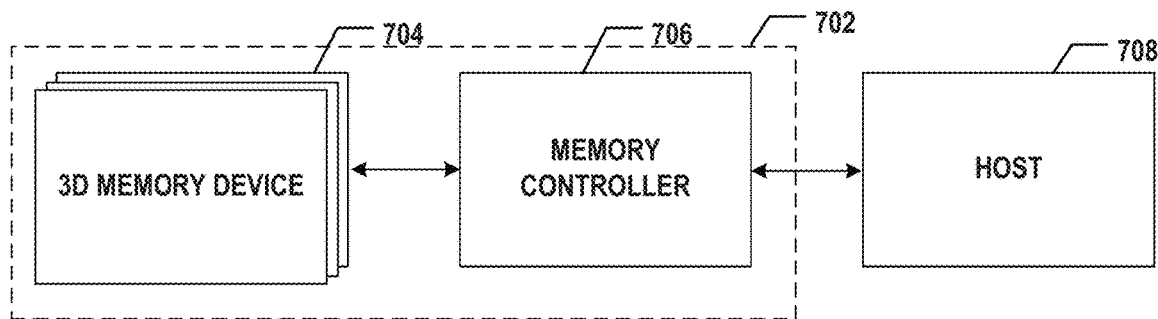
FIG. 7 illustrates a block diagram of an exemplary system having a 3D memory device, according to some aspects of the present disclosure.

FIG. 7 illustrates a block diagram of an exemplary system 700 having a 3D memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, system 700 can include a host 708 and a memory system 702 having one or more 3D memory devices 704 and a memory controller 706. Host 708 can be a processor of an electronic device, such as a central processing unit (CPU), or a system-on-chip (SoC), such as an application processor (AP). Host 708 can be configured to send or receive data to or from 3D memory devices 704.

3D memory device 704 can be any 3D memory devices disclosed herein, such as 3D memory devices 100 and 160 shown in FIGS. 1A and 1B. In some implementations, each 3D memory device 704 includes a NAND Flash memory. Consistent with the scope of the present disclosure, the semiconductor channel of 3D memory device 704 can be partially doped such that part of the semiconductor channel that forms the source contact is highly doped to lower the potential barrier while leaving another part of the semiconductor channel that forms the memory cells remaining undoped or lowly doped. One end of each channel structure of 3D memory device 704 can be opened from the backside to expose the doped part of the respective semiconductor channel. 3D memory device 704 can further include a doped semiconductor layer electrically connecting the exposed doped parts of the semiconductor channels to further reduce the contact resistance and sheet resistance. Moreover, 3D memory device 704 can include a composite dielectric film having a gate dielectric portion that faces the source select gate line(s). The gate dielectric portion can be free of silicon nitride (e.g., including only silicon oxide) and act as the gate dielectric of the SSG transistor. As a result, the electric performance of 3D memory device 704 can be improved, which in turn improves the performance of memory system 702 and system 700, e.g., achieving higher operation speed.

Memory controller 706 (a.k.a., a controller circuit) is coupled to 3D memory device 704 and host 708 and is configured to control 3D memory device 704, according to some implementations. For example, the controller circuit may be configured to operate composite dielectric film 126 via stack conductive layers 116 (e.g., source select gate line(s) 201). Memory controller 706 can manage the data stored in 3D memory device 704 and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, formatting 3D memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 8A, 8B:
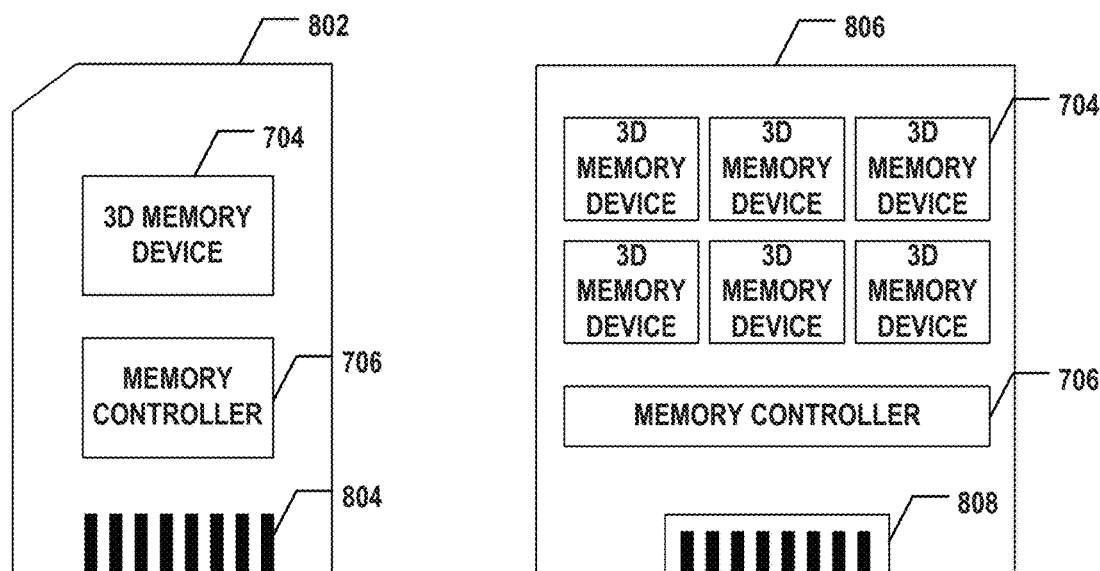
FIG. 8A illustrates a diagram of an exemplary memory card having a 3D memory device, according to some aspects of the present disclosure.
FIG. 8B illustrates a diagram of an exemplary solid-state drive (SSD) having a 3D memory device, according to some aspects of the present disclosure.

Memory controller 706 and one or more 3D memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 8A, memory controller 706 and a single 3D memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 electrically coupling memory card 802 with a host (e.g., host 708 in FIG. 7). In another example as shown in FIG. 8B, memory controller 706 and multiple 3D memory devices 704 may be integrated into an SSD 806. SSD 806 can further include an SSD connector 808 electrically coupling SSD 806 with a host (e.g., host 708 in FIG. 7). In some implementations, the storage capacity and/or the operation speed of SSD 806 is greater than those of memory card 802.

Figure 3E:
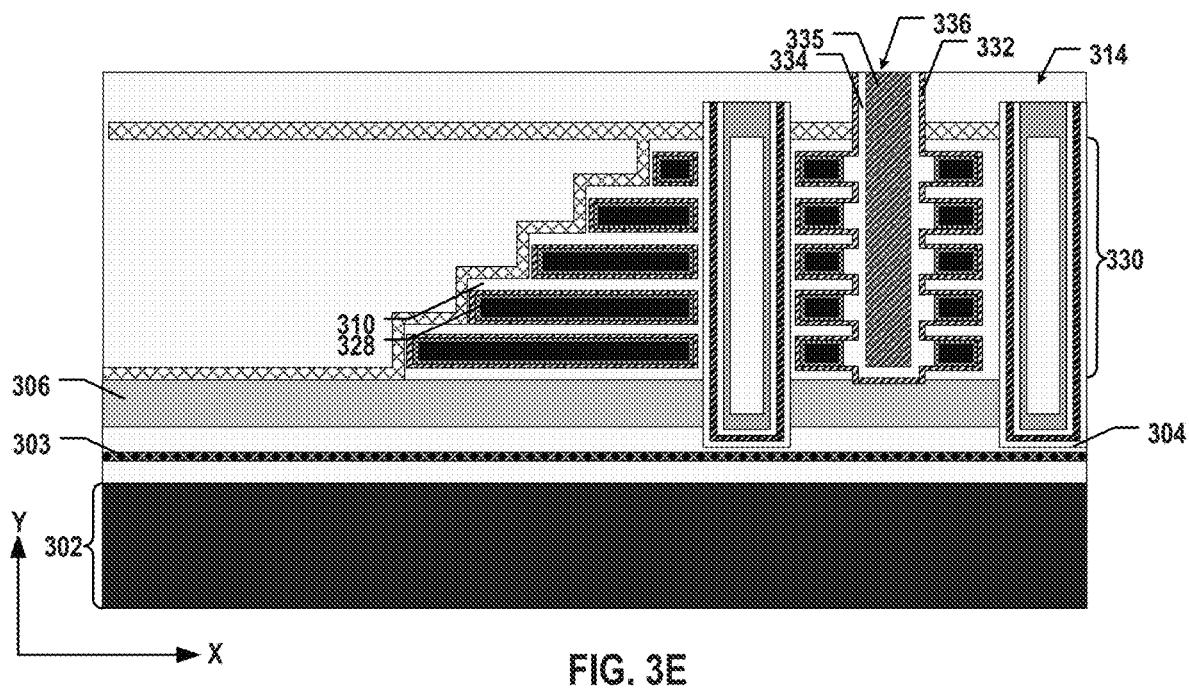
Figure 3F:
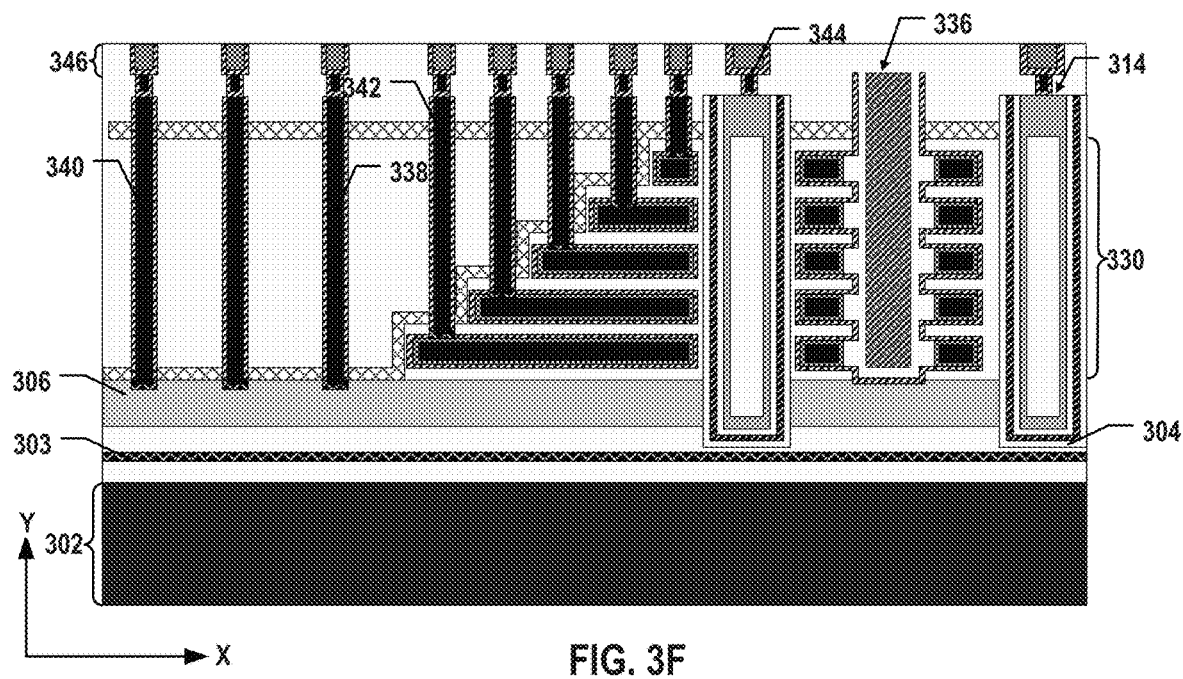
Figure 3G:
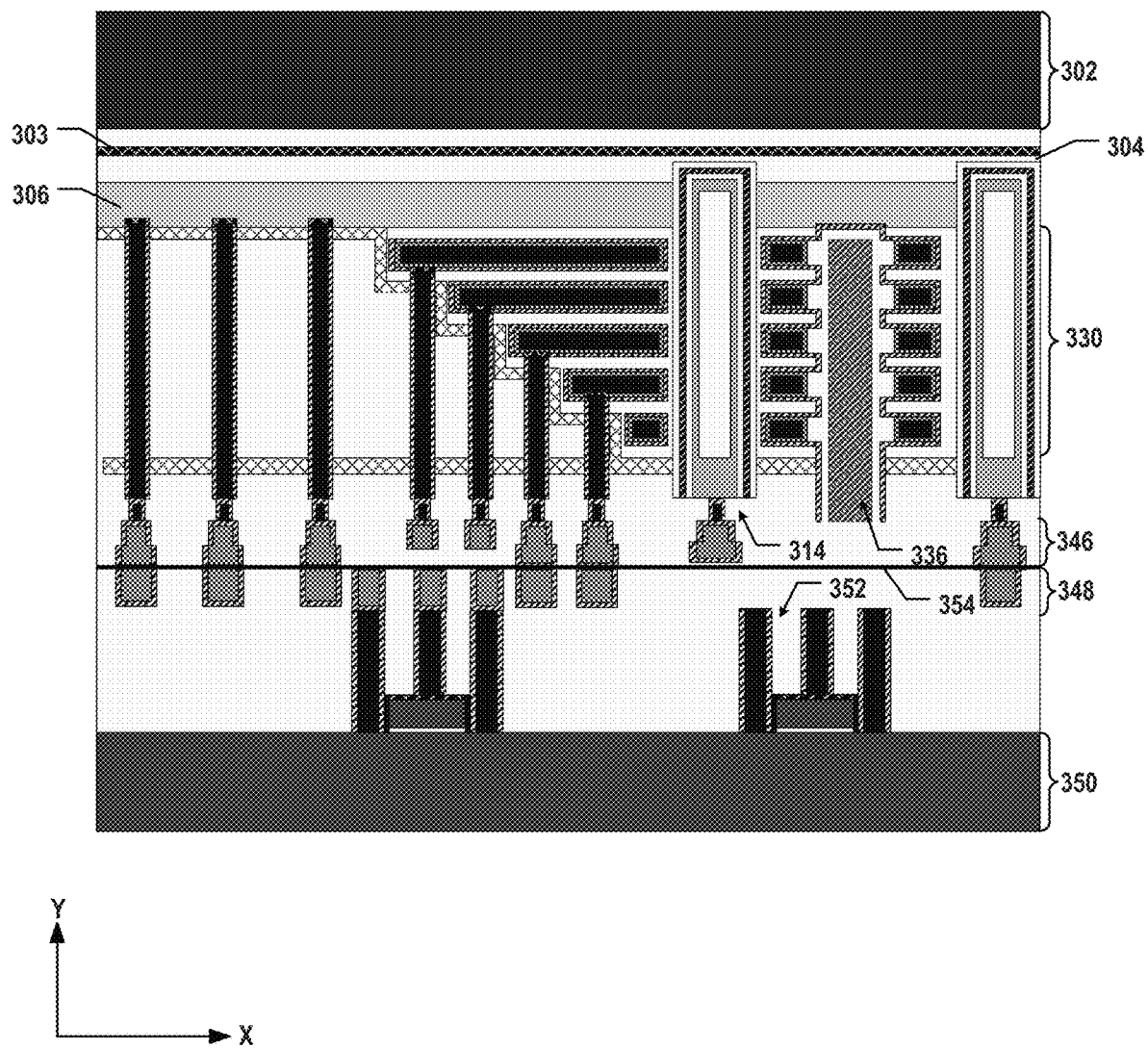
Figure 3H:
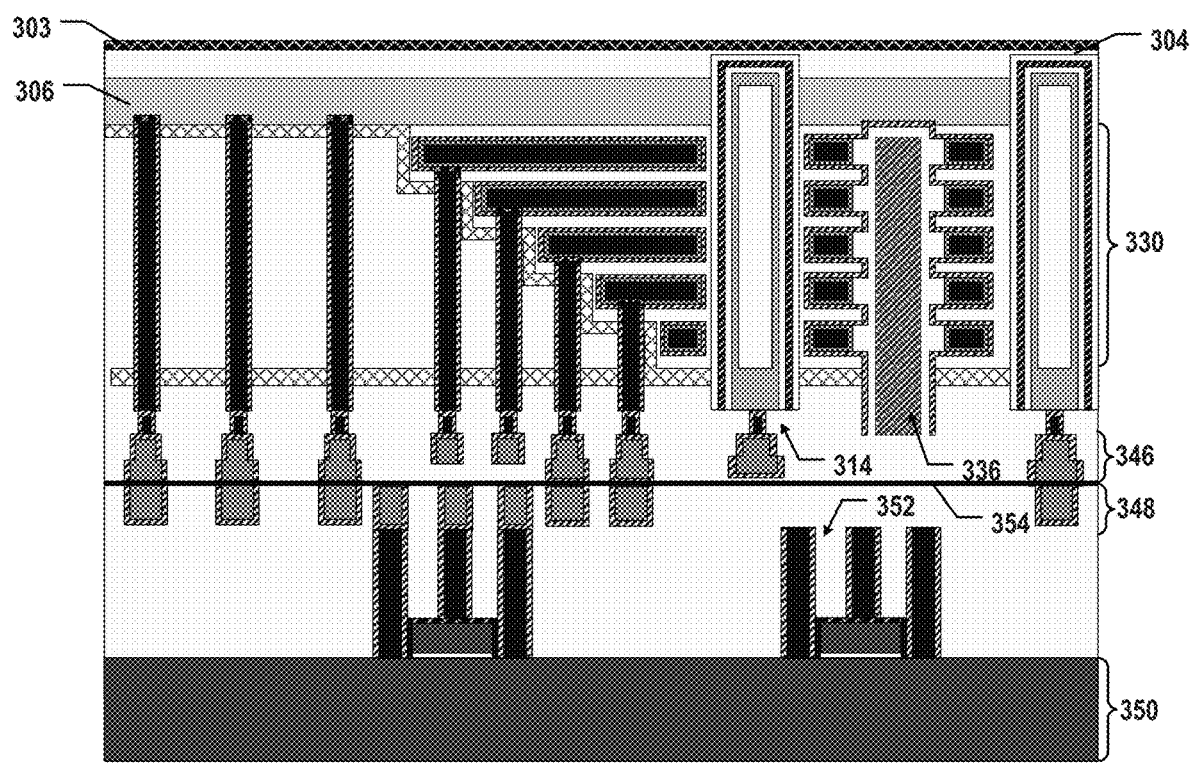
Figure 3I:
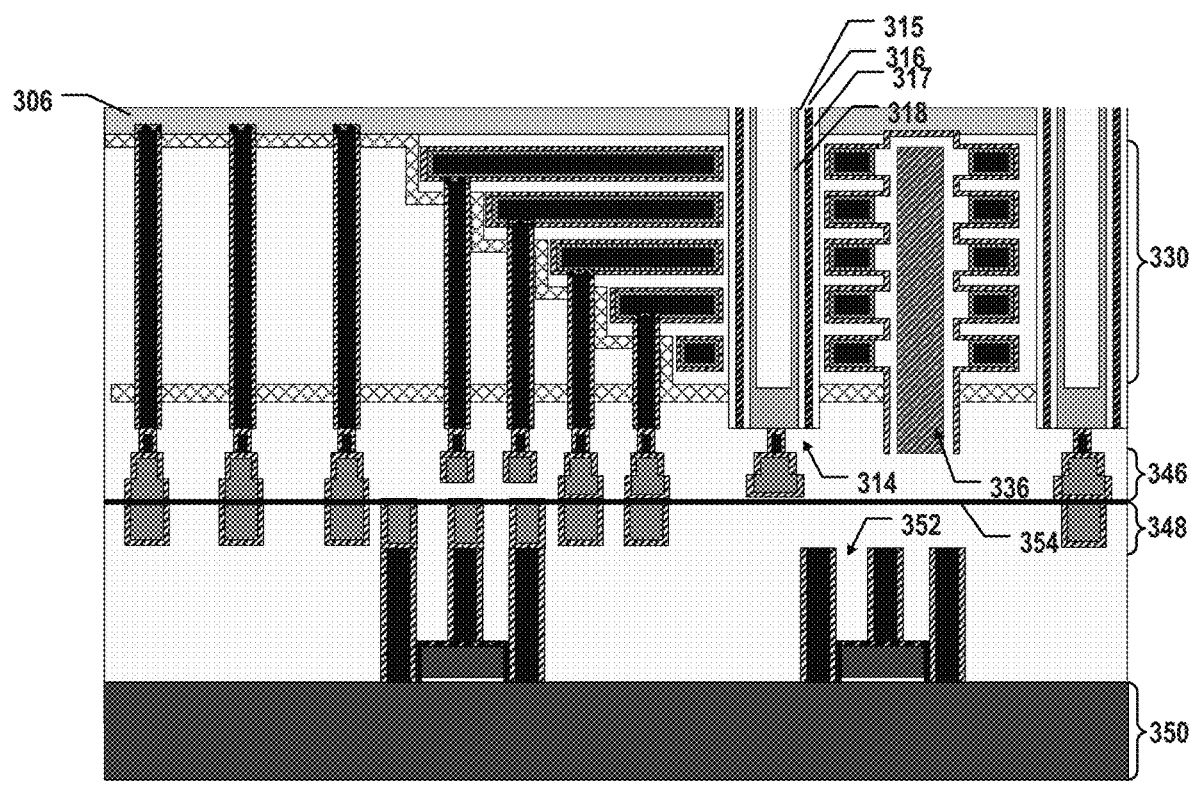
Figure 3J:
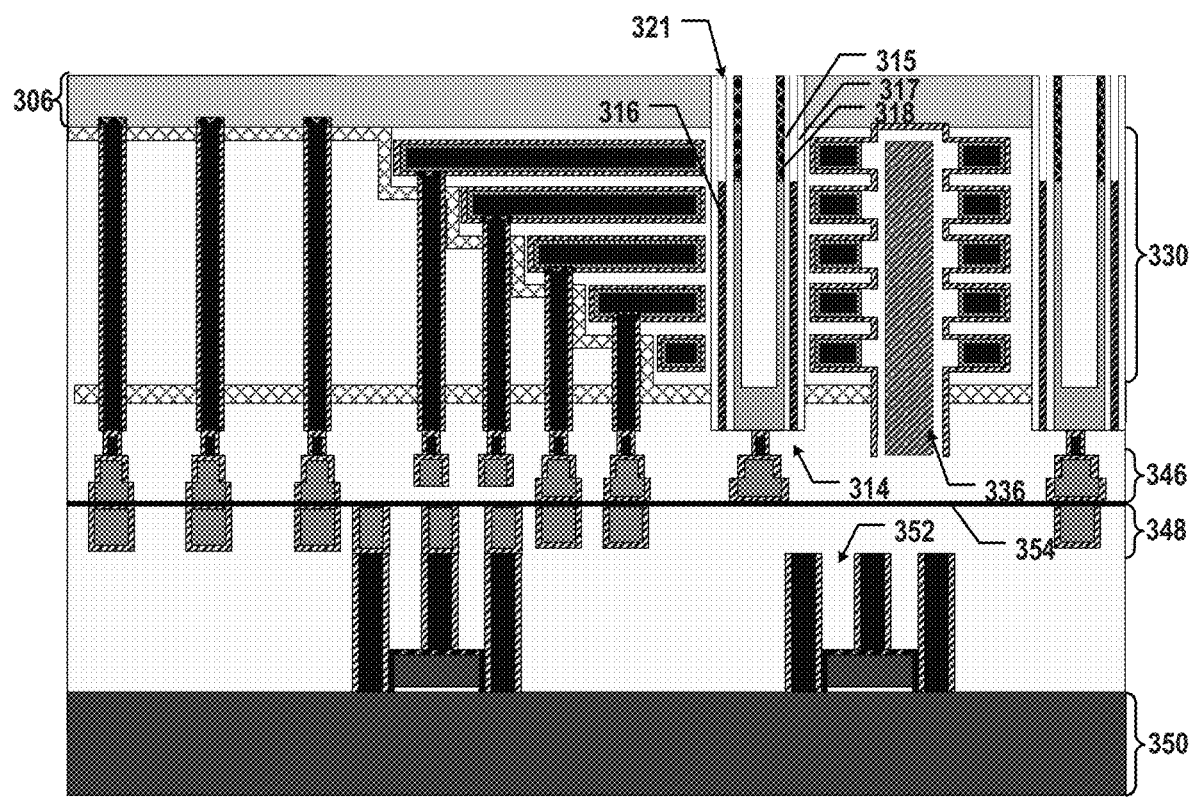
Figure 3K:
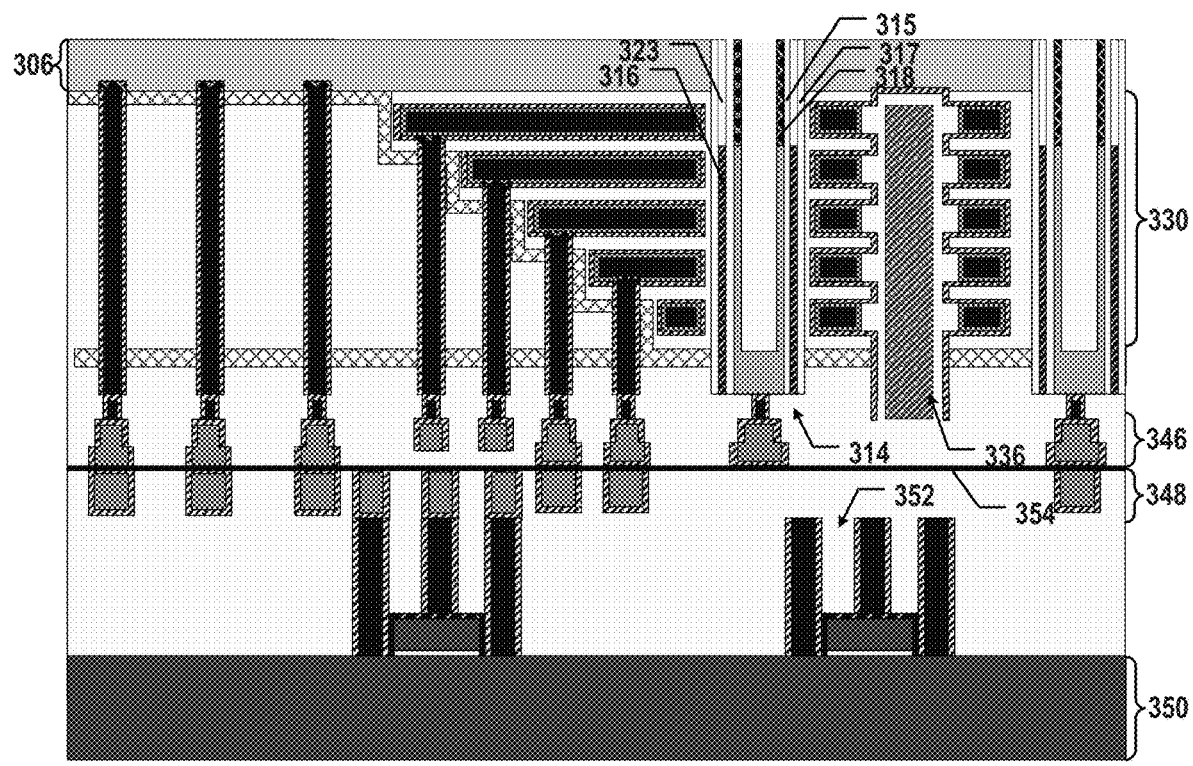
Figure 3L:
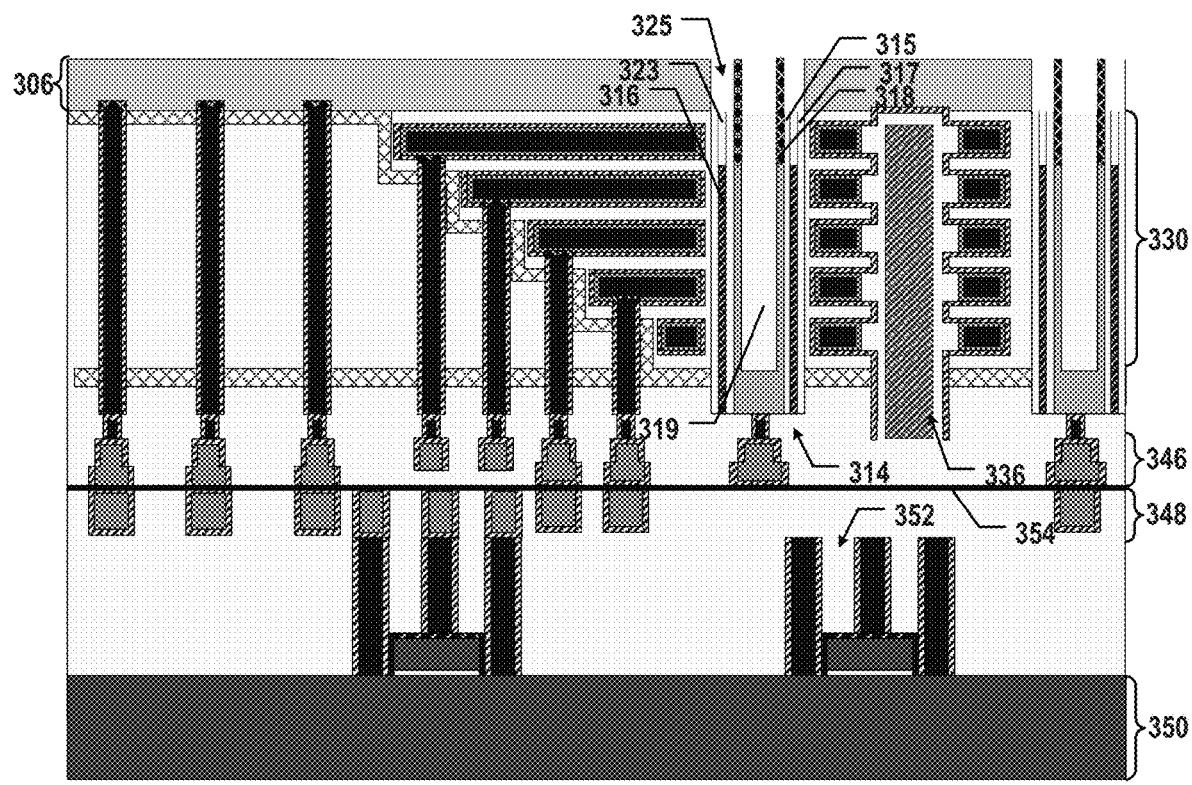
Figure 3M:
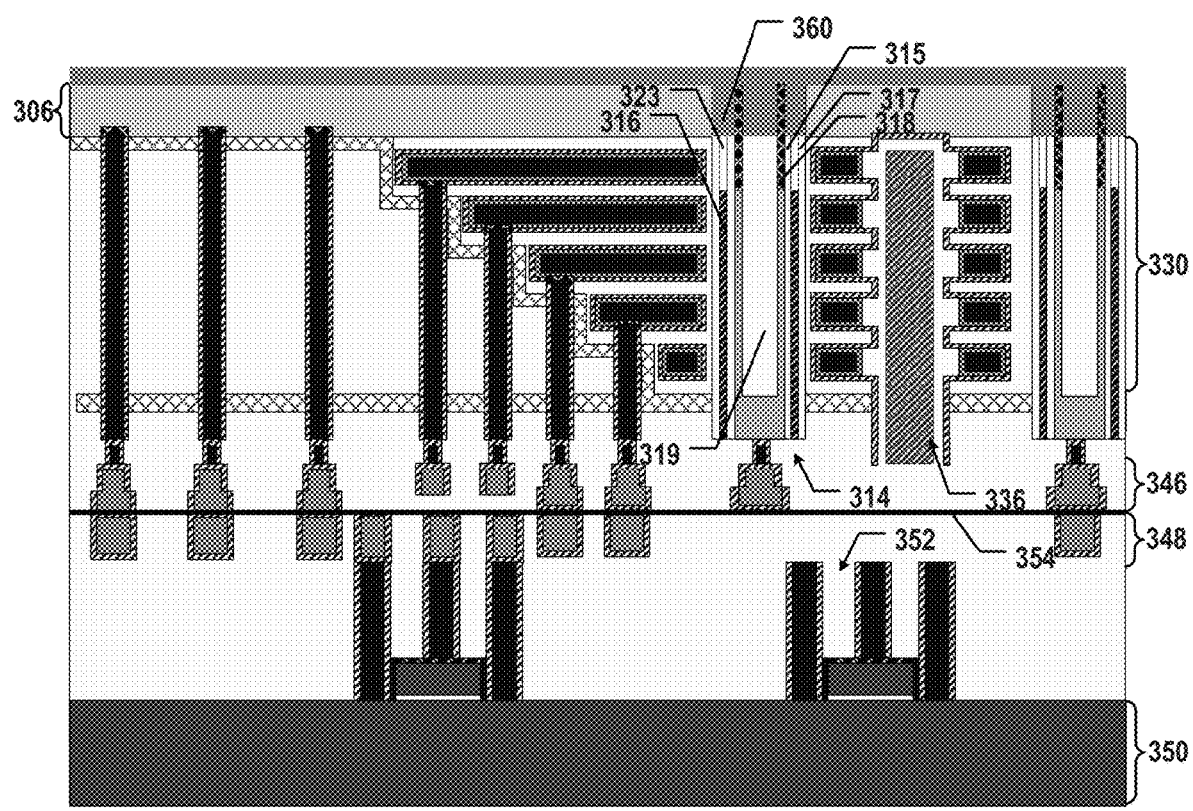
Figure 3N:
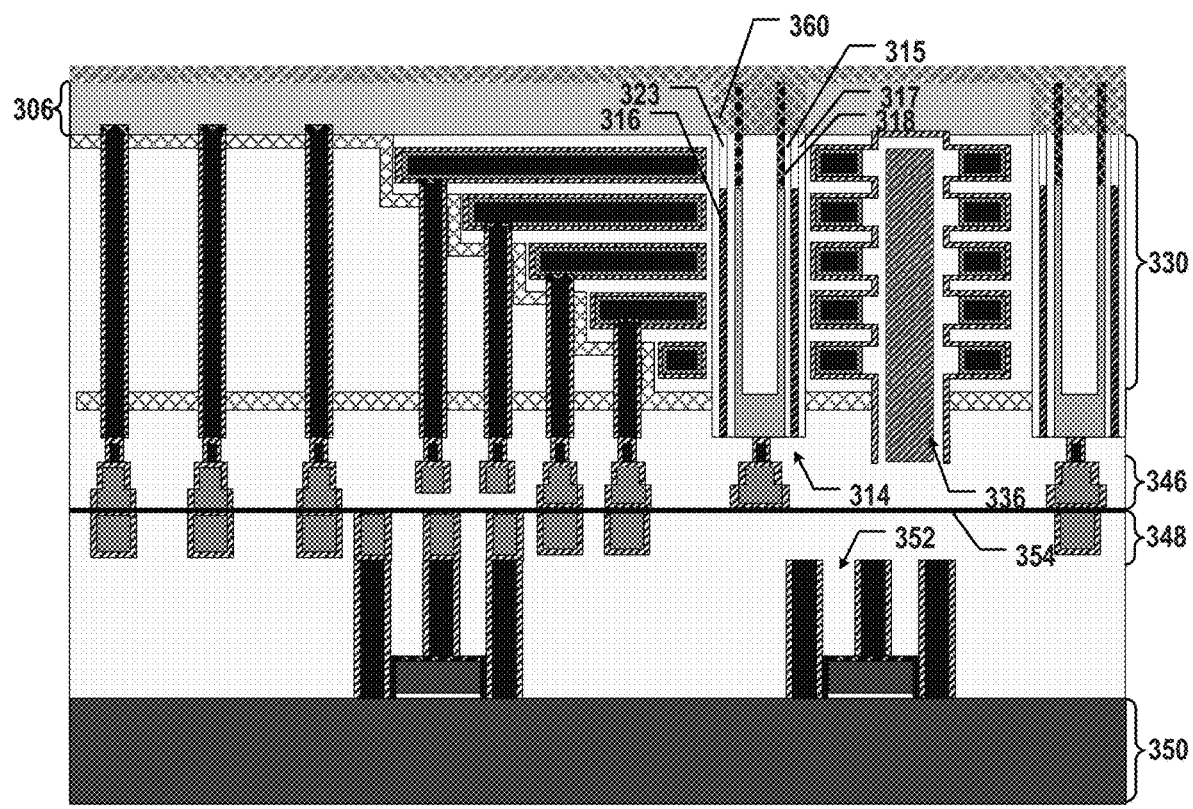
Figure 3O:
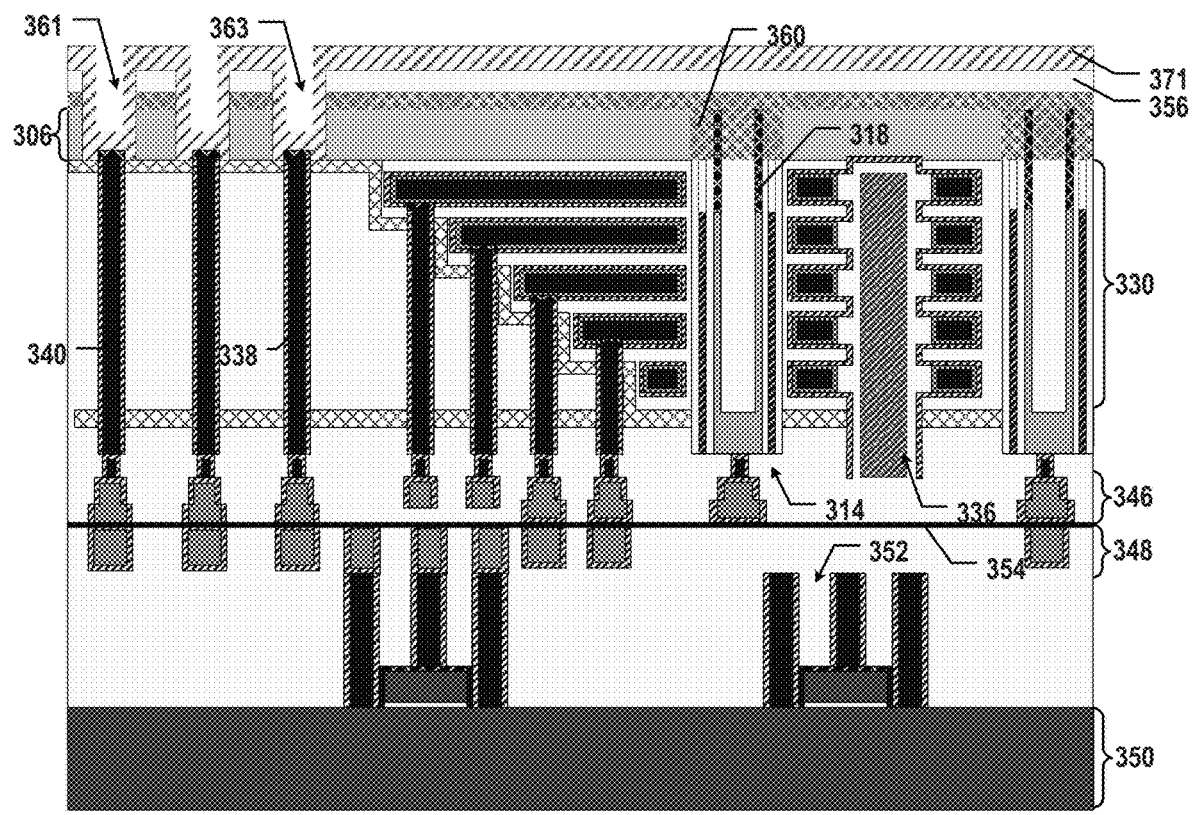
Figure 3P:
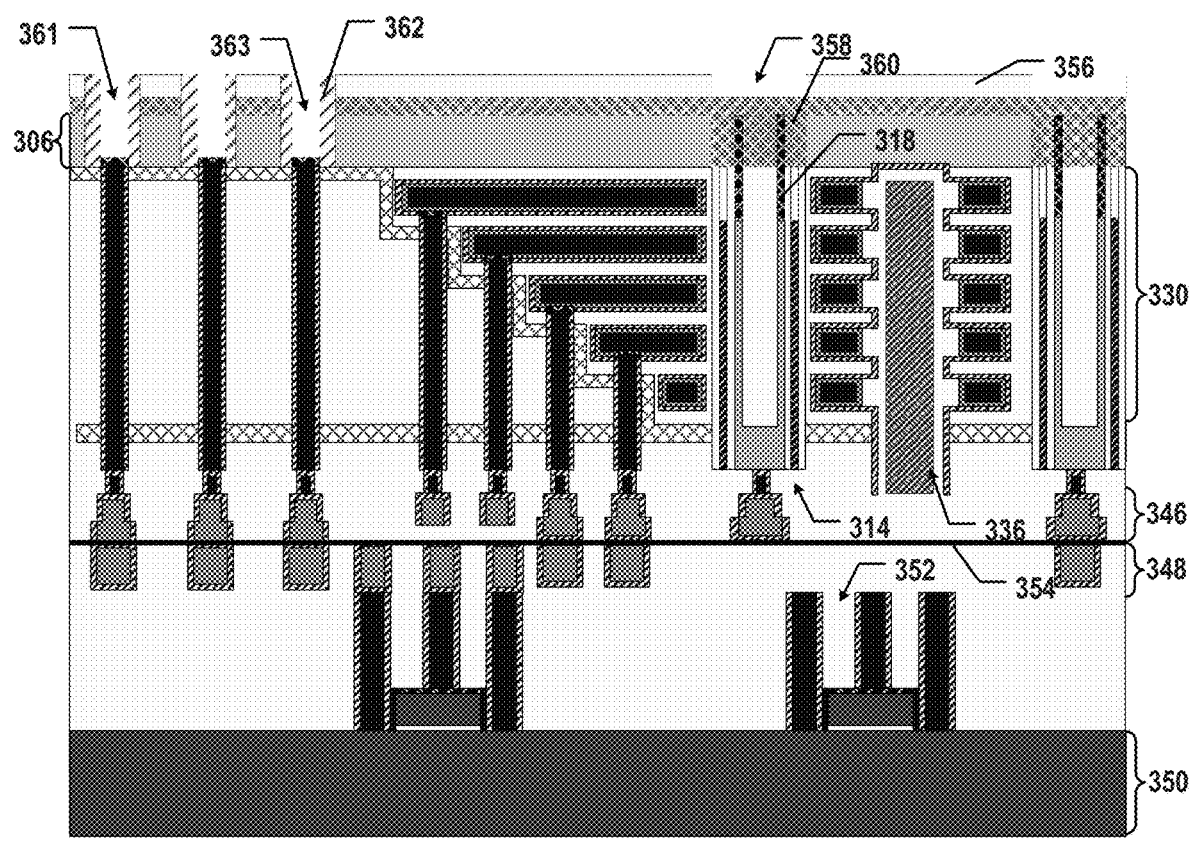
Figure 3P:
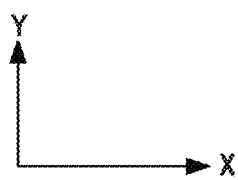
Figure 3Q:
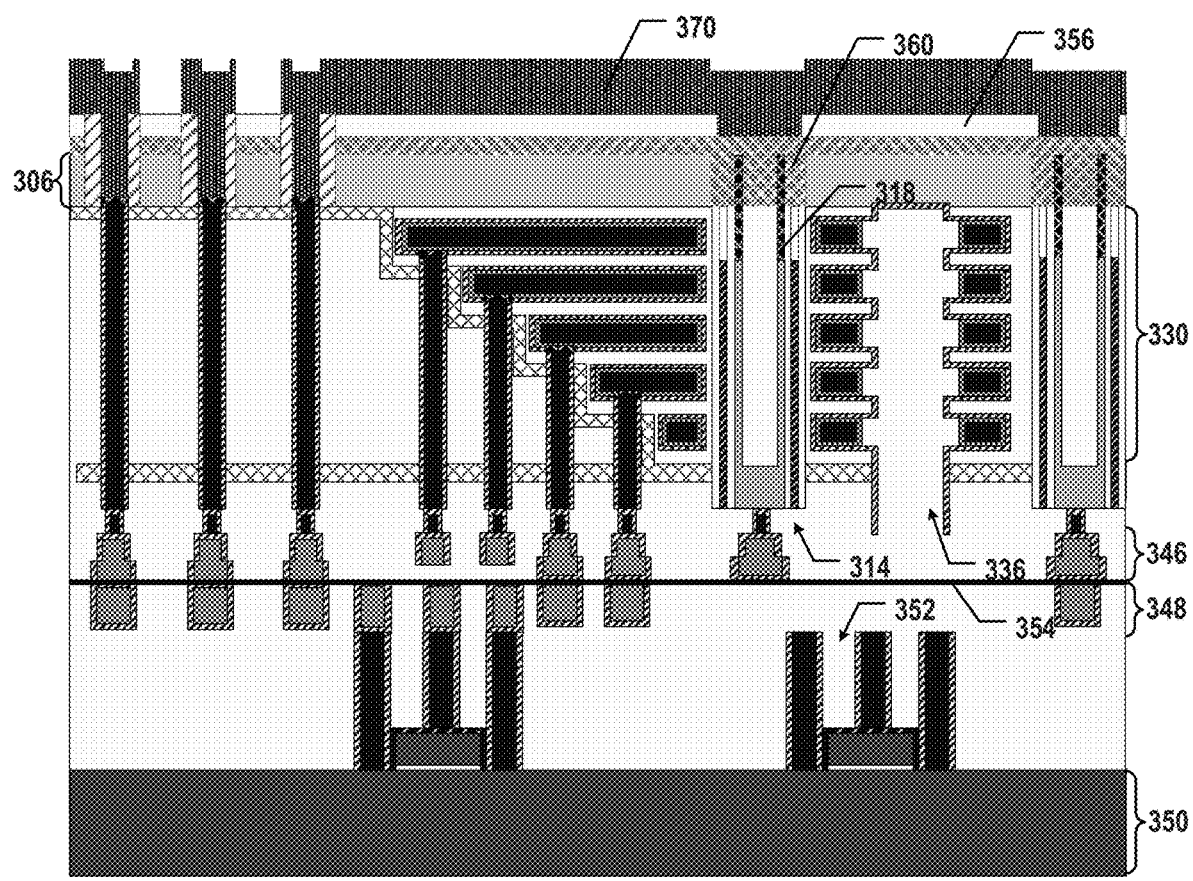
Figure 3Q:
Figure 5:
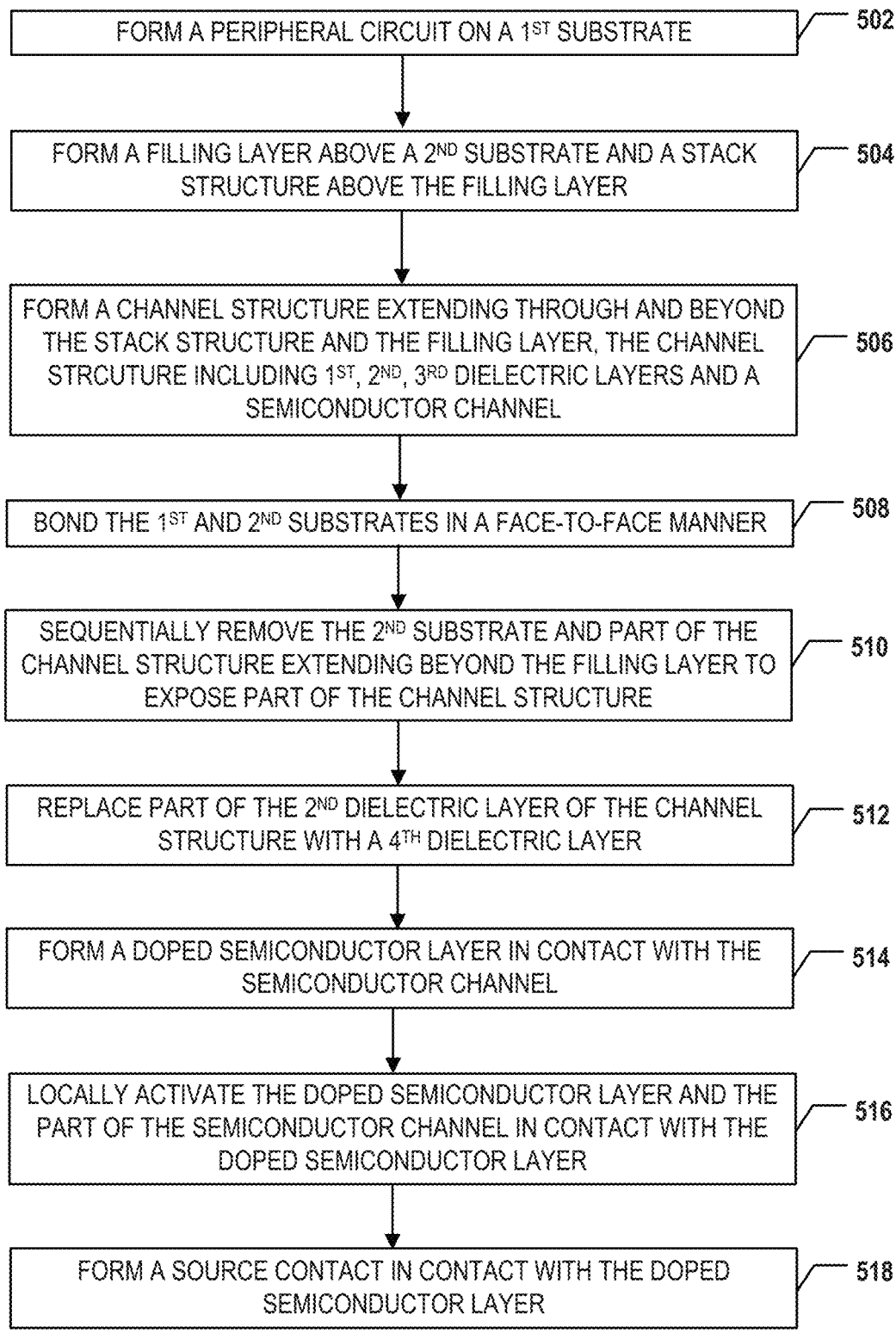
FIG. 5 illustrates a flowchart of an exemplary method for forming a 3D memory device, according to some aspects of the present disclosure.

FIGS. 3A-3Q illustrate a fabrication process for forming an exemplary 3D memory device, according to some implementations of the present disclosure. FIG. 5 illustrates a flowchart of a method 500 for forming an exemplary 3D memory device, according to some implementations of the present disclosure. Examples of the 3D memory device depicted in FIGS. 3A-3Q and 5 include 3D memory device 100 depicted in FIG. 1A. FIGS. 3A-3Q and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a peripheral circuit is formed on a first substrate. The first substrate can be a silicon substrate. As illustrated in FIG. 3G, a plurality of transistors are formed on a silicon substrate 350 using a plurality of processes including, but not limited to, photolithography, etching, thin film deposition, thermal growth, implantation, chemical mechanical polishing (CMP), and any other suitable processes. In some implementations, doped regions (not shown) are formed in silicon substrate 350 by ion implantation and/or thermal diffusion, which function, for example, as source regions and/or drain regions of the transistors. In some implementations, isolation regions (e.g., STIs) are also formed in silicon substrate 350 by wet etching and/or dry etching and thin film deposition. The transistors can form peripheral circuits 352 on silicon substrate 350.

As illustrated in FIG. 3G, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof; the bonding contacts through the ILD layer are formed using wet etching and/or dry etching, e.g., reactive ion etching (RIE), followed by one or more thin film deposition processes, such as ALD, CVD, PVD, any other suitable processes, or any combination thereof.

Method 500 proceeds to operation 504, as illustrated in FIG. 5, in which a filling layer is formed above a second substrate, and a stack structure is formed above the filling layer. The filling layer and stack structure can be formed on the front side of the second substrate on which semiconductor devices can be formed. The second substrate can be a silicon substrate. It is understood that since the second substrate will be removed from the final product, the second substrate may be part of a dummy wafer, for example, a carrier substrate, made of any suitable materials, such as glass, sapphire, plastic, silicon, to name a few, to reduce the cost of the second substrate. In some implementations, the substrate is a carrier substrate. In some implementations, the filling layer includes polysilicon, a high-k dielectric, or a metal, and the stack structure includes a dielectric stack having interleaved stack dielectric layers and stack sacrificial layers. It is understood that in some examples, the stack structure may include a memory stack having interleaved stack dielectric layers (e.g., silicon oxide layers) and stack conductive layers (e.g., polysilicon layers).

To better control the gauging and surface flatness of various structures to be formed on the second substrate, a variety of stop layers can be formed between the second substrate and the filling layer. In some implementations, a first stop layer and a second stop layer are sequentially formed between the second substrate and the filling layer. The first stop layer can include silicon oxide or silicon nitride, and the second stop layer can include silicon oxide or polysilicon. In some implementations, a third stop layer, such as a silicon nitride layer or a polysilicon layer, is formed between the second stop layer and the filling layer. In some implementations, a single stop layer, such as a silicon oxide layer or a high-k dielectric layer, is formed between the second substrate and the filling layer.

As illustrated in FIG. 3A, a first stop layer 303 is formed above a carrier substrate 302, a second stop layer 304 is formed on first stop layer 303, and a filling layer 306 is formed on second stop layer 304. Filling layer 306 can include polysilicon, a high-k dielectric, or a metal. Second stop layer 304 can act as an etch stop layer when etching the channel holes from the front side and thus, may include any suitable materials that have a high etching selectivity (e.g., greater than about 5) with respect to the material directly on second stop layer 304, such as silicon oxide or polysilicon. First stop layer 303 can act as a CMP/etch stop layer when removing carrier substrate 302 from the backside and thus, may include any suitable materials other than the material of carrier substrate 302, such as silicon nitride or silicon oxide. It is understood that in some examples, pad oxide layers (e.g., silicon oxide layers) may be formed between carrier substrate 302 and first stop layer 303 to relax the stress between different layers and avoid peeling.

As shown in FIG. 3A, a stack of silicon oxide layer (pad oxide layer), silicon nitride layer (first stop layer 303), and silicon oxide layer (second stop layer 304) can be sequentially formed on carrier substrate 302 using one or more thin film deposition processes including, but not limited to, CVD, PVD, ALD, or any combination thereof. In some implementations, filling layer 306 is formed by depositing polysilicon, or any other suitable materials, such as a high-k dielectric or a metal, on second stop layer 304 using one or more thin film deposition processes including, but not limited to, CVD, PVD, ALD, or any combination thereof. For ease of description, the combination of the stop layers shown in FIG. 3A is used through the present disclosure to describe the fabrication process. It is understood that, however, any other suitable combinations of stop layer(s) may be used in other examples as well. In an example not shown, a single oxide layer or a high-k dielectric layer (as first and second stop layers 303 and 304) may be formed on carrier substrate 302 using one or more thin film deposition processes including, but not limited to, CVD, PVD, ALD, or any combination thereof.

As illustrated in FIG. 3B, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on filling layer 306. Dielectric stack 308 includes interleaved stack sacrificial layers 312 and stack dielectric layers 310, according to some implementations. Stack dielectric layers 310 and stack sacrificial layers 312 can be alternatingly deposited on filling layer 306 above carrier substrate 302 to form dielectric stack 308. In some implementations, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. As illustrated in FIG. 3B, a staircase structure can be formed on the edge of dielectric stack 308. The staircase structure can be formed by performing a plurality of so-called "trim-etch" cycles to the dielectric layer pairs of dielectric stack 308 toward carrier substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3B.

Method 500 proceeds to operation 506, as illustrated in FIG. 5, in which a channel structure extending through and beyond the dielectric stack and the filling layer is formed. The channel structure can include a first dielectric layer, a second dielectric layer, a third dielectric layer, and a semiconductor channel. In some implementations, to form the channel structure, a channel hole extending through the dielectric stack and the filling layer is formed, stopping at the second stop layer, and the first dielectric layer, the second dielectric layer, the third dielectric layer, and the semiconductor channel are sequentially formed in the channel hole. In some implementations, the second dielectric layer includes a dielectric material different from the first and third dielectric layers. For example, the second dielectric layer may include silicon nitride.

As illustrated in FIG. 3B, each channel hole is an opening extending vertically through and beyond dielectric stack 308 and filling layer 306, stopping at second stop layer 304. In some implementations, a plurality of openings are formed, such that each opening becomes the location for growing an individual channel structure 314 in the later process. In some implementations, fabrication processes for forming the channel holes of channel structures 314 include wet etching and/or dry etching, such as deep RIE (DRIE). The etching of the channel holes continues until being stopped by second stop layer 304, such as silicon oxide or polysilicon, according to some implementations. In some implementations, the etching conditions, such as etching rate and time, can be controlled to ensure that each channel hole has reached and stopped by second stop layer 304 to minimize the gouging variations among the channel holes and channel structures 314 formed therein. It is understood that depending on the specific etching selectivity, one or more channel holes may extend into second stop layer 304 to a small extent, which is still viewed as being stopped by second stop layer 304 in the present disclosure.

As illustrated in FIG. 3B, a first dielectric layer 317, a second dielectric layer 316, a third dielectric layer 315, and a semiconductor channel 318 are sequentially formed in this order along sidewalls and the bottom surface of the channel hole. In some implementations, first, second, and third dielectric layers 317, 316, and 315 are first deposited along the sidewalls and bottom surface of the channel hole in this order using one or more thin film deposition processes, such as ALD, CVD, PVD, any other suitable processes, or any combination thereof, to form the memory film. Semiconductor channel 318 then can be formed by depositing a semiconductor material, such as polysilicon (e.g., undoped polysilicon), over third dielectric layer 315 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are sequentially deposited to form first dielectric layer 317, second dielectric layer 316, third dielectric layer 315, and semiconductor channel 318.

As illustrated in FIG. 3B, a capping layer 319 is formed in the channel hole and over semiconductor channel 318 to fully or partially fill the channel hole (e.g., without or with an air gap). Capping layer 319 can be formed by depositing a dielectric material, such as silicon oxide, using one or more thin film deposition processes, such as ALD, CVD, PVD, any other suitable processes, or any combination thereof. A channel plug can then be formed in the top portion of the channel hole. A recess can be formed in the top portion of the channel hole by wet etching and/or drying etching parts of semiconductor channel 318 and capping layer 319 in the top portion of the channel hole. The channel plug can then be formed by depositing semiconductor materials, such as polysilicon, into the recess by one or more thin film deposition processes, such as CVD, PVD, ALD, or any combination thereof. Channel structure 314 is thereby formed through and beyond dielectric stack 308 and filling layer 306, stopping at second stop layer 304, according to some implementations.

As illustrated in FIG. 3C, a slit 320 is an opening that extends vertically through dielectric stack 308 and stops at filling layer 306. In some implementations, fabrication processes for forming slit 320 include wet etching and/or dry etching, such as DRIE. A gate replacement then can be performed through slit 320 to replace dielectric stack 308 with a memory stack 330 (shown in FIG. 3E).

As illustrated in FIG. 3D, lateral recesses 322 are first formed by removing stack sacrificial layers 312 (shown in FIG. 3C) through slit 320. In some implementations, stack sacrificial layers 312 are removed by applying etchants through slit 320, creating lateral recesses 322 interleaved between stack dielectric layers 310. The etchants can include any suitable etchants that etch stack sacrificial layers 312 selective to stack dielectric layers 310.

As illustrated in FIG. 3E, stack conductive layers 328 (including gate electrodes and adhesive layers) are deposited into lateral recesses 322 (shown in FIG. 3D) through slit 320. In some implementations, a gate dielectric layer 332 is deposited into lateral recesses 322 prior to stack conductive layers 328, such that stack conductive layers 328 are deposited on gate dielectric layer 332. Stack conductive layers 328, such as metal layers, can be deposited using one or more thin film deposition processes, such as ALD, CVD, PVD, any other suitable processes, or any combination thereof. In some implementations, gate dielectric layer 332, such as a high-k dielectric layer, is formed along the sidewall and at the bottom of slit 320 as well. Memory stack 330 including interleaved stack conductive layers 328 and stack dielectric layers 310 is thereby formed, replacing dielectric stack 308 (shown in FIG. 3D), according to some implementations.

As illustrated in FIG. 3E, an insulating structure 336 extending vertically through memory stack 330 is formed, stopping on the top surface of filling layer 306. Insulating structure 336 can be formed by depositing one or more dielectric materials, such as silicon oxide, into slit 320 to fully or partially fill slit 320 (with or without an air gap) using one or more thin film deposition processes, such as ALD, CVD, PVD, any other suitable processes, or any combination thereof. In some implementations, insulating structure 336 includes gate dielectric layer 332 (e.g., including high-k dielectrics) and a dielectric capping layer 334 (e.g., including silicon oxide). In some implementations, dielectric capping layer 334 may partially fill the slit 320, and a polysilicon core layer 335 may fill the remaining space of slit 320 as part of insulating structure 336 to adjust the mechanical properties, such as hardness or stress, of insulating structure 336.

As illustrated in FIG. 3F, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

As illustrated in FIG. 3F, a bonding layer 346 is formed above channel local contacts 344, word line local contacts 342, and peripheral contacts 338 and 340. Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 500 proceeds to operation 508, as illustrated in FIG. 5, in which the first substrate and the second substrate are bonded in a face-to-face manner, such that the memory stack is above the peripheral circuit. The bonding can include hybrid bonding. As illustrated in FIG. 3G, carrier substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between carrier substrate 302 and silicon substrate 350, according to some implementations. In some implementations, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352.

Figure 6:
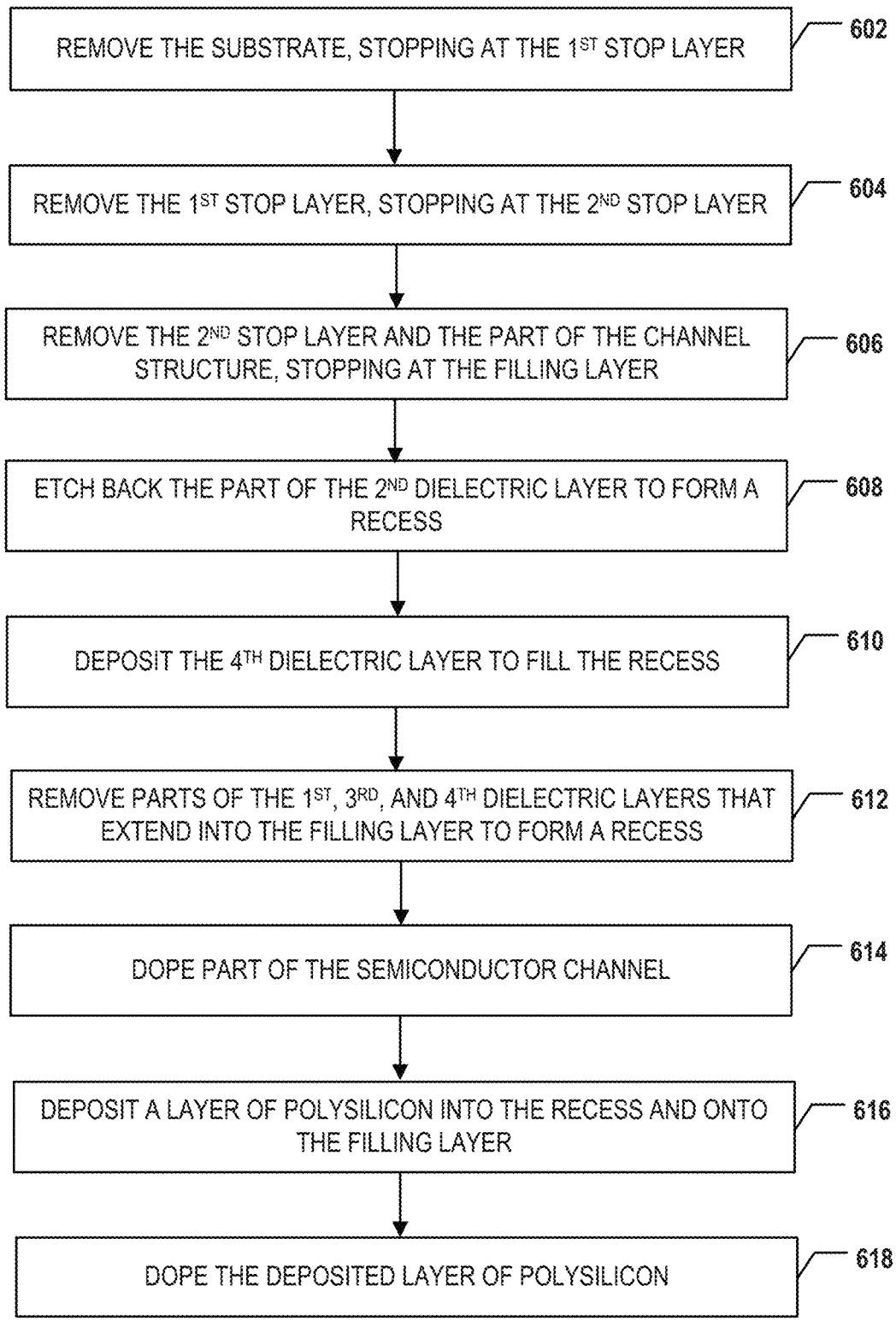
FIG. 6 illustrates a flowchart of another exemplary method for forming a 3D memory device, according to some aspects of the present disclosure.

Method 500 proceeds to operation 510, as illustrated in FIG. 5, in which the second substrate and part of the channel structure extending beyond the filling layer are sequentially removed to expose part of the channel structure. The removal can be performed from the backside of the second substrate. As shown in FIG. 6, in some implementations, to sequentially remove the second substrate and the part of the channel structure, at 602, the second substrate is removed, stopping at the first stop layer; at 604, the first stop layer is removed, stopping at the second stop layer; at 606, the second stop layer and the part of the channel structure are removed, stopping at the filling layer. In some implementations, the removed part of the channel structure extends into the second stop layer, and the second stop layer and the part of the channel structure extending into the second stop layer are polished.

As illustrated in FIG. 3H, carrier substrate 302 (and a pad oxide layer between carrier substrate 302 and first stop layer 303, shown in FIG. 3G) are completely removed from the backside until being stopped by first stop layer 303 (e.g., a silicon nitride layer). Carrier substrate 302 can be completely removed using CMP, grinding, dry etching, and/or wet etching. In some implementations, carrier substrate 302 is peeled off. In some implementations in which carrier substrate 302 includes silicon and first stop layer 303 includes silicon nitride, carrier substrate 302 is removed using silicon CMP, which can be automatically stopped when reaching first stop layer 303 having materials other than silicon, i.e., acting as a backside CMP stop layer. In some implementations, carrier substrate 302 (a silicon substrate) is removed using wet etching by tetramethylammonium hydroxide (TMAH), which is automatically stopped when reaching first stop layer 303 having materials other than silicon, i.e., acting as a backside etch stop layer. First stop layer 303 can ensure the complete removal of carrier substrate 302 without the concern of thickness uniformity after thinning.

As shown in FIG. 3I, first and second stop layers 303 and 304 (shown in FIG. 3H) then can be completely removed as well using wet etching with suitable etchants, such as phosphoric acid and hydrofluoric acid, until being stopped by filling layer 306 having a different material (e.g., polysilicon) from second stop layer 304. As shown in FIG. 3I, part of channel structure 314 extending beyond filling layer 306 is removed, such that the upper end of channel structure 314 becomes flush with the top surface of filling layer 306. In some implementations in which part of channel structure 314 extends into second stop layer 304, second stop layer 304 and the part of channel structure 314 extending into second stop layer 304 are removed together by polishing, such as CMP, stopping at filling layer 306. It is understood that in case that channel structure 314 does not extend beyond filling layer 306 and into second stop layer 304, the removal of the upper end of channel structure 314 may be skipped.

The removal of parts of channel structure 314 from the backside is much less challenging and has a higher production yield compared with the known solutions using front side wet etching via the openings (e.g., slit 320 in FIG. 3D) through dielectric stack 308/memory stack 330 with a high aspect ratio (e.g., greater than 50). By avoiding the issues introduced by the high aspect ratio of slit 320, the fabrication complexity and cost can be reduced, and the yield can be increased. Also, the vertical scalability (e.g., the increasing level of dielectric stack 308/memory stack 330) can be improved as well.

Method 500 proceeds to operation 512, as illustrated in FIG. 5, in which part of the second dielectric layer of the channel structure is replaced with a fourth dielectric layer including a dielectric material different from the second dielectric layer. As shown in FIG. 6, in some implementations, to replace the part of the second dielectric layer of the channel structure with the fourth dielectric layer, the part of the second dielectric layer is etched back to form a recess at 608, and the fourth dielectric layer is deposited to fill the recess at 610.

As illustrated in FIG. 3J, part of second dielectric layer 316 is removed to form a recess 321 surrounded by the top portions of first and third dielectric layers 317 and 315. For example, part of second dielectric layer 316 of channel structure 314 may be etched back to form recess 321, for example, using dry etching and/or wet etching. The etching of second dielectric layer 316 can be controlled by controlling the etching time and/or etching rate, such that the etching does not continue beyond the source select gate line(s) (e.g., one or more stack conductive layers 328 closest to filling layer 306).

As illustrated in FIG. 3K, a fourth dielectric layer 323 is deposited to partially or fully fill recess 321 (in FIG. 3J), such that the removed part of second dielectric layer 316 is replaced by fourth dielectric layer 323. Fourth dielectric layer 323 can be in contact with the remainder of second dielectric layer 316 along the vertical direction, as well as in contact with first and third dielectric layers 317 and 315, respectively, along the lateral direction. In some implementations, fourth dielectric layer 323 includes silicon oxide, the same dielectric material of first and third dielectric layers 317 and 315, while second dielectric layer 316 includes silicon nitride. To form fourth dielectric layer 323, a dielectric material (e.g., silicon nitride) can be deposited in recess 321 using one or more thin film deposition processes, such as ALD, CVD, PVD, any other suitable processes, or any combination thereof, followed by CMP to remove the excess dielectric material.

It is understood that in some examples, recess 321 may be partially filled with fourth dielectric layer 323, such that an air gap is also formed in fourth dielectric layer 323. It is further understood that in some examples, recess 321 may not be filled with fourth dielectric layer 323 at all, such that recess 321 remains as an air gap in the final product the 3D memory device.

As shown in FIG. 6, in some implementations, parts of the first, third, and fourth dielectric layers that extend into the filling layer are removed to form a recess at 612, and part of the semiconductor channel exposed by the recess is doped at 614.

As illustrated in FIG. 3L, parts of first, third, and fourth dielectric layers 317, 315, and 323 and capping layer 319 are removed to form a recess 325 to expose the top portion of semiconductor channel 318. For example, first, third, and fourth dielectric layers 317, 315, and 323 and capping layer 319 of channel structure 314 may have the same dielectric material, such as silicon oxide, and thus, may be selectively etched back against semiconductor channel 318 having polysilicon using wet etching with hydrofluoric acid as the etchant. The etching of first, third, and fourth dielectric layers 317, 315, and 323 and capping layer 319 can be controlled by controlling the etching time and/or etching rate, such that the etching does not continue beyond filling layer 306 into memory stack 330. The formation of recess 325 can expose part of semiconductor channel 318. In some implementations, the top portion of semiconductor channel 318 exposed by recess 325 is doped to increase its conductivity. For example, a tilted ion implantation process may be performed to dope the top portion of semiconductor channel 318 (e.g., including polysilicon) exposed by recess 325 with any suitable dopants (e.g., N-type dopants such as P, As, or Sb) to a desired doping concentration.

Method 500 proceeds to operation 514, as illustrated in FIG. 5, in which a doped semiconductor layer in contact with the exposed part of the semiconductor channel is formed. In some implementations, the dopants include an N-type dopant. As shown in FIG. 6, in some implementations, to form the doped semiconductor layer, at 616, a layer of polysilicon is deposited into the recess and onto the filling layer, and at 612, the deposited layer of polysilicon is doped.

As illustrated in FIG. 3M, a doped semiconductor layer 360 is formed in recess 325 (shown in FIG. 3J), surrounding and in contact with the exposed part of semiconductor channel 318, as well as outside of recess 321 on filling layer 306. In some implementations, to form doped semiconductor layer 360, a semiconductor layer (e.g., polysilicon) is deposited in recess 325 in contact with the exposed part of semiconductor channel 318, first, third, and fourth dielectric layers 317, 315, and 323, and capping layer 319, as well as outside of recess 321 in contact with filling layer 306 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 360, in-situ doping of N-type dopants, such as P, As, or Sb, is performed when depositing the semiconductor layer into recess 325 and on filling layer 306. In some implementations, a CMP process can be performed to remove any excess doped semiconductor layer 360 as needed.

Method 500 proceeds to operation 516, as illustrated in FIG. 5, in which the doped semiconductor layer and the part of the semiconductor channel that is in contact with the doped semiconductor layer are locally activated. In some implementations, to locally activate, heat is applied in a confined area having the doped semiconductor layer and the part of the semiconductor channel to activate dopants in the doped semiconductor layer and the part of the semiconductor channel. The confined area can be between the stack structure and the doped semiconductor layer. In some implementations, the doping concentration of the doped semiconductor layer and the doping concentration of the part of the semiconductor channel in contact with the doped semiconductor layer each is between $10^{19}$ cm$^{-3}$ and $10^{21}$ cm$^{-3}$ after the activation.

As illustrated in FIG. 3N, doped semiconductor layer 360 and the part of semiconductor channel 318 in contact with doped semiconductor layer 360 are locally activated. In some implementations, heat is applied in a confined area having doped semiconductor layer 360 and the part of semiconductor channel 318 to activate the dopant(s) therein, such as N-type dopants (e.g., P, As, or Sb). For example, the confined area may be between memory stack 330 and doped semiconductor layer 360 in the vertical direction. The heat can be applied and focused by any suitable techniques, such as annealing, laser, ultrasound, or any other suitable thermal process. In some implementations, the confined area that can be affected by the heat during the local activation process does not extend to and beyond bonding interface 354 to avoid heating bonding interface 354 and Cu interconnects used for connecting peripheral circuits 352. The local activation process can activate the dopants doped into doped semiconductor layer 360 (and the exposed part of semiconductor channel 318 in case it is already doped). As a result, the doping concentration of doped semiconductor layer 360 and the doping concentration of the exposed part of semiconductor channel 318 each is between $10^{19}$ cm$^{-3}$ and $10^{21}$ cm$^{-3}$ after the activation. In some implementations, the local activation process is controlled such that the dopants in doped semiconductor layer 360 (and in the exposed part of semiconductor channel 318 in case it is already doped) can diffuse from the source of channel structure 314 towards the drain of channel structure 314 until beyond the source select gate line(s) (e.g., one or more stack conductive layers 328 closest to filling layer 306), but not facing the word lines, as described above with respect to FIG. 2A. In case the exposed part of semiconductor channel 318 has not been doped yet, doped semiconductor layer 360 can act as the doping source during the local activation process to diffuse the dopants from doped semiconductor layer 360 into semiconductor channel 318, such that at least the part of semiconductor channel 318 that is in contact with doped semiconductor layer 360 can become a doped portion, and doped semiconductor layer 360 and the doped portion of semiconductor channel 318 can have the same dopants and doping concentration.

The local activation process can activate the dopants such that the dopants can occupy the silicon lattices to reduce the contact resistance between doped semiconductor layer 360 and semiconductor channel 318 as well as to reduce the sheet resistance of doped semiconductor layer 360. On the other hand, by confining the heat during the local activation process into an area without heat-sensitive structures, any potential damages to the heat-sensitive structures, such as bonding interface 354 and Cu interconnects used for connecting peripheral circuits 352, can be reduced or avoided.

Method 500 proceeds to operation 518, as illustrated in FIG. 5, in which a source contact is formed in contact with the doped semiconductor layer. As illustrated in FIG. 3O, one or more ILD layers 356 are formed on doped semiconductor layer 360. ILD layers 356 can be formed by depositing dielectric materials on the top surface of doped semiconductor layer 360 using one or more thin film deposition processes, such as ALD, CVD, PVD, any other suitable processes, or any combination thereof. As illustrated in FIG. 3P, source contact openings 358 can be formed through ILD layers 356 to expose parts of doped semiconductor layer 360. In some implementations, source contact opening 358 is formed using wet etching and/or dry etching, such as RIE.

As illustrated in FIG. 3Q, a source contact, as part of conductive layer 370, is formed in each source contact opening 358 (shown in FIG. 3P) at the backside of filling layer 306. The source contact is above and in contact with doped semiconductor layer 360, according to some implementations. In some implementations, conductive layer 370, such as Al, is deposited into source contact opening 358 using one or more thin film deposition processes, such as ALD, CVD, PVD, any other suitable processes, or any combination thereof, to fill source contact opening 358. A planarization process, such as OH, can then be performed to remove excess conductive layer 370.

As illustrated in FIG. 3Q, in some implementations, conductive layer 370 also includes a redistribution layer above and in contact with the source contacts. That is, conductive layer 370 is not only deposited into source contact openings 358 as the source contacts, but also deposited outside of source contact openings 358 onto ILD layers 356 as the redistribution layer that electrically connects multiple source contacts, according to some implementations.

As illustrated in FIG. 3Q, in some implementations, conductive layer 370 further includes contacts extending through ILD layers 356, doped semiconductor layer 360, and filling layer 306. That is, conductive layer 370 is not only deposited into source contact openings 358 as the source contacts, but also deposited into contact openings 363 and 361 (shown in FIG. 3P) as the contacts that are electrically connected to peripheral contacts 338 and 340. As illustrated in FIGS. 3Q and 3P, contact openings 363 and 361 each extending through a spacer layer 371, ILD layers 356, doped semiconductor layer 360, and filling layer 306 are formed using wet etching and/or dry etching, such as RIE. In some implementations, contact openings 363 and 361 are patterned using lithography to be aligned with peripheral contacts 338 and 340, respectively. The etching of contact openings 363 and 361 can stop at the upper ends of peripheral contacts 338 and 340 to expose peripheral contacts 338 and 340. As illustrated in FIG. 3P, a spacer 362 is formed from spacer layer 371 along the sidewalls of contact openings 363 and 361 to electrically separate doped semiconductor layer 360.

Figure 4A:
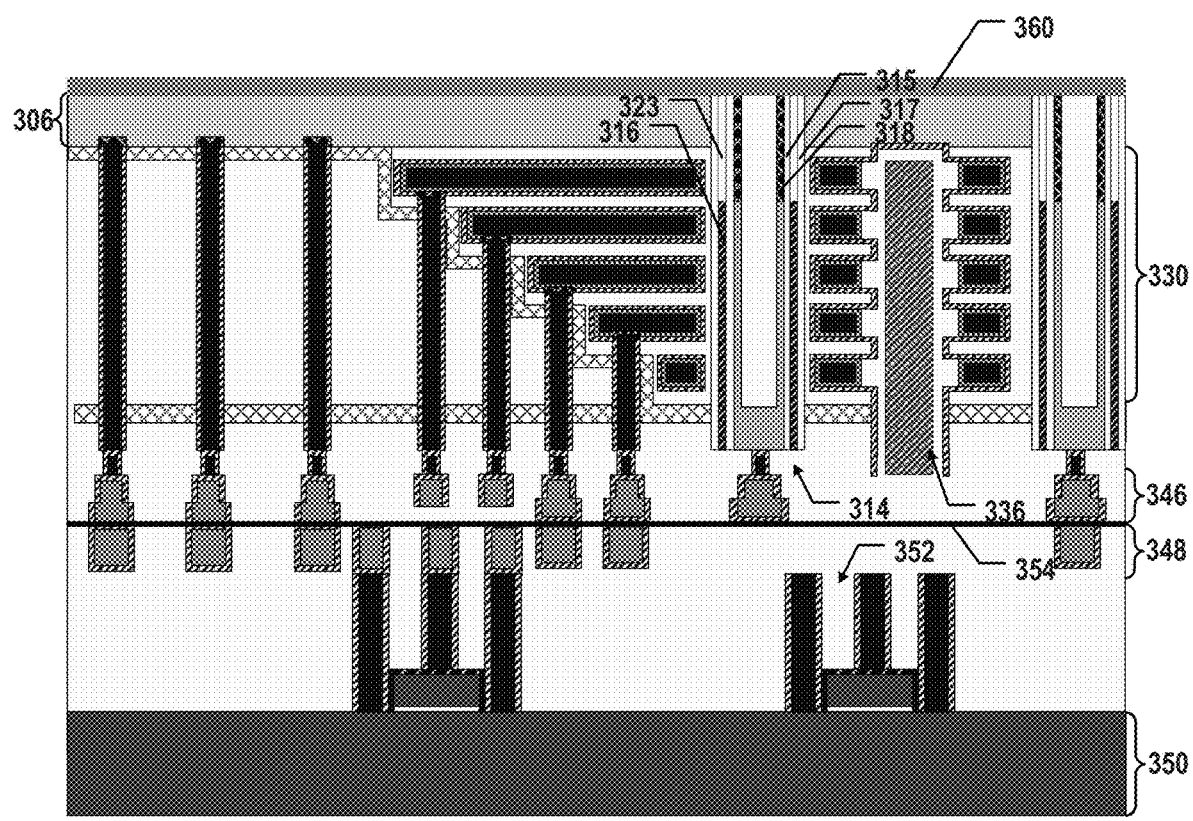
FIGS. 4A and 4B illustrate a fabrication process for forming another exemplary 3D memory device, according to some aspects of the present disclosure.
Figure 4B:
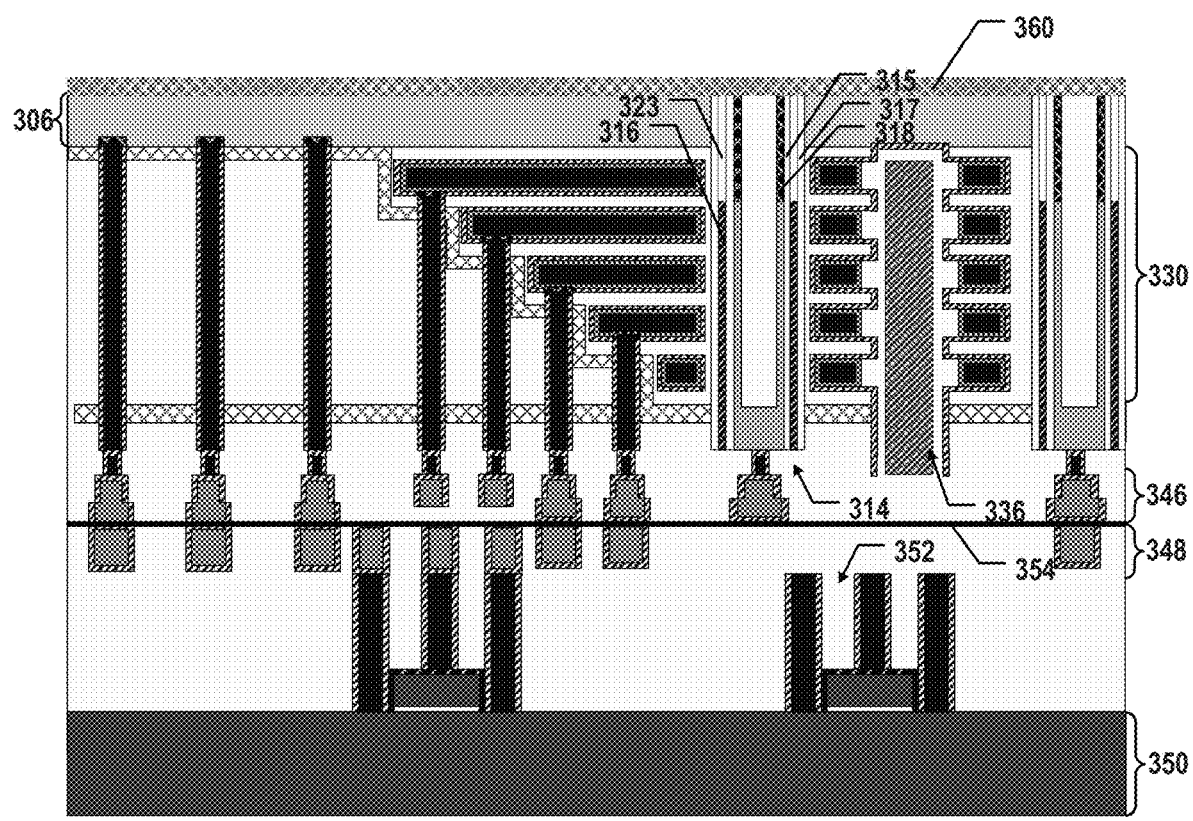

FIGS. 4A and 4B illustrate a fabrication process for forming another exemplary 3D memory device, according to some implementations of the present disclosure. Examples of the 3D memory device depicted in FIGS. 4A and 4B include 3D memory device 160 depicted in FIG. 1B. Different from FIG. 3L in which recess 325 is formed by etching back first, third, and fourth dielectric layers 317, 315, and 323 and capping layer 319, as shown in FIG. 4A, the top portion of semiconductor channel 318 is doped to increase its conductivity without first etching back first, third, and fourth dielectric layers 317, 315, and 323 and capping layer 319 to expose part of semiconductor channel 318. For example, a tilted ion implantation process may be performed to dope the top portion of semiconductor channel 318 (e.g., including polysilicon) with any suitable dopants (e.g., N-type dopants such as P, As, or Sb) to a desired doping concentration.

In some implementations, to form the doped semiconductor layer, a layer of polysilicon is deposited onto the filling layer, and the deposited layer of polysilicon is doped. As shown in FIG. 4A, doped semiconductor layer 360 is formed on filling layer 306 as well as on the upper end of channel structure 314. In some implementations, to form doped semiconductor layer 360, semiconductor layer (e.g., polysilicon) is deposited on filling layer 306 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 360, in-situ doping of N-type dopants, such as P, As, or Sb, is performed when depositing the semiconductor layer on filling layer 306. In some implementations, a CHIP process can be performed to remove any excess doped semiconductor layer 360 as needed.

As shown in FIG. 4B, doped semiconductor layer 360 and the doped portion of semiconductor channel 318 are locally activated. In some implementations, heat is applied in a confined area having doped semiconductor layer 360 and the doped portion of semiconductor channel 318 to activate the dopant(s) therein, such as N-type dopants (e.g., P, As, or Sb). The local activation process can activate the dopants doped into doped semiconductor layer 360 and the doped portion of semiconductor channel 318. As a result, the doping concentration of doped semiconductor layer 360 and the doping concentration of the doped portion of semiconductor channel 318 each is between $10^{19}$ cm$^{-3}$ and $10^{21}$ cm$^{-3}$ after the activation. In some implementations, the local activation process is controlled such that the dopants in doped semiconductor layer 360 and the doped portion of semiconductor channel 318 can diffuse from the source of channel structure 314 towards the drain of channel structure 314 until beyond the source select gate line(s) (e.g., one or more stack conductive layers 328 closest to filling layer 306), but not facing the word lines, as described above with respect to FIG. 2A.

According to one aspect of the present disclosure, a 3D memory device includes a stack structure including interleaved conductive layers and dielectric layers, a doped semiconductor layer, and a channel structure extending through the stack structure and in contact with the doped semiconductor layer. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, one of the conductive layers that is closest to the doped semiconductor layer.

In some implementations, the memory portion of the composite dielectric film includes a blocking layer, a storage layer, and a tunneling layer stacking along the first direction, and the gate dielectric portion of the composite dielectric film comprises a first gate dielectric layer, a second gate dielectric layer, and a third gate dielectric layer.

In some implementations, the blocking layer and the first gate dielectric layer include a same dielectric material, the tunneling layer and the third gate dielectric layer include a same dielectric material, and the storage layer and the second gate dielectric layer include different dielectric materials.

In some implementations, the storage layer includes silicon nitride.

In some implementations, each of the blocking layer, the tunneling layer, and the first and third gate dielectric layers includes silicon oxide.

In some implementations, the first, second, and third dielectric layers include a same dielectric material.

In some implementations, the one of the conductive layers includes a source select gate line.

In some implementations, the semiconductor channel includes a doped portion, and a part of the doped portion faces, along the first direction, the one of the conductive layers that is closest to the doped semiconductor layer.

In some implementations, the doped portion of the semiconductor channel and the doped semiconductor layer each includes N-type doped polysilicon.

In some implementations, the 3D memory device further includes a filling layer between the stack structure and the doped semiconductor layer.

In some implementations, the doped semiconductor layer includes a plate and a plug extending from the plate into the filling layer and in contact with the semiconductor channel.

In some implementations, the doped semiconductor layer is configured to generate GIDL-assisted body bias when performing an erase operation.

In some implementations, the composite dielectric film radially circumscribes the semiconductor channel along the first direction.

According to another aspect of the present disclosure, a 3D memory device includes a stack structure including interleaved conductive layers and dielectric layers, and a channel structure extending through the stack structure. The conductive layers include one or more source select gate lines and a plurality of word lines. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, the one or more source select gate lines. The semiconductor channel includes a doped portion. A part of the doped portion faces, along the first direction, the one or more source select gate lines.

In some implementations, the composite dielectric film radially circumscribes the semiconductor channel along the first direction.

In some implementations, the 3D memory device further includes a doped semiconductor layer in contact with the doped portion of the semiconductor channel. In some implementations, the source select gate lines are closer to the doped semiconductor layer than the word lines.

In some implementations, the memory portion of the composite dielectric film includes a blocking layer, a storage layer, and a tunneling layer stacking along the first direction, and the gate dielectric portion of the composite dielectric film includes a first gate dielectric layer, a second gate dielectric layer, and a third gate dielectric layer.

In some implementations, the blocking layer and the first gate dielectric layer include a same dielectric material, the tunneling layer and the third gate dielectric layer include a same dielectric material, and the storage layer and the second gate dielectric layer include different dielectric materials.

In some implementations, the storage layer includes silicon nitride.

In some implementations, each of the blocking layer, the tunneling layer, and the first and third gate dielectric layers includes silicon oxide.

In some implementations, the first, second, and third dielectric layers include a same dielectric material.

In some implementations, the 3D memory device further includes a filling layer between the stack structure and the doped semiconductor layer.

In some implementations, the doped semiconductor layer includes a plate and a plug extending from the plate into the filling layer and in contact with the semiconductor channel.

In some implementations, the doped semiconductor layer is configured to generate GIDL-assisted body bias when performing an erase operation.

In some implementations, the doped portion of the semiconductor channel and the doped semiconductor layer each includes N-type doped polysilicon.

According to still another aspect of the present disclosure, a system includes a 3D memory device configured to store data and a controller circuit coupled to the 3D memory device. The 3D memory device includes a stack structure including interleaved conductive layers and dielectric layers, and a channel structure extending through the stack structure. The conductive layers include one or more source select gate lines and a plurality of word lines. The channel structure includes a composite dielectric film and a semiconductor channel along a first direction. The composite dielectric film includes a gate dielectric portion and a memory portion along a second direction perpendicular to the first direction. A part of the gate dielectric portion faces, along the first direction, the one or more source select gate lines. The semiconductor channel includes a doped portion. A part of the doped portion faces, along the first direction, the one or more source select gate lines. The controller circuit is configured to operate the composite dielectric film via the conductive layers.

According to yet another aspect of the present disclosure, a method for forming a 3D memory device is provided. A filling layer is formed above a substrate. A stack structure is formed above the filling layer. A channel structure extending through and beyond the stack structure and the filling layer is formed. The channel structure includes a first dielectric layer, a second dielectric layer, a third dielectric layer, and a semiconductor channel. The substrate and a part of the channel structure extending beyond the filling layer are sequentially removed to expose a part of the channel structure. A part of the second dielectric layer of the channel structure is replaced with a fourth dielectric layer including a dielectric material different from the second dielectric layer.

In some implementations, the second dielectric layer includes a dielectric material different from the first and third dielectric layers.

In some implementations, the second dielectric layer includes silicon nitride.

In some implementations, to replace the part of the second dielectric layer of the channel structure with the fourth dielectric layer, the part of the second dielectric layer is etched back to form a recess, and the fourth dielectric layer is deposited to fill the recess.

In some implementations, a doped semiconductor layer is formed in contact with the semiconductor channel, and the doped semiconductor layer and the part of the semiconductor channel in contact with the doped semiconductor layer are locally activated.

In some implementations, to locally activate, heat is applied in a confined area having the doped semiconductor layer and the part of the semiconductor channel to activate dopants in the doped semiconductor layer and the part of the semiconductor channel.

In some implementations, the confined area is between the stack structure and the doped semiconductor layer.

In some implementations, prior to forming the doped semiconductor layer, the part of the semiconductor channel is doped.

In some implementations, parts of the first, third, and fourth dielectric layers that extend into the filling layer are removed to form a recess.

In some implementations, to form the doped semiconductor layer, a layer of polysilicon is deposited into the recess and onto the filling layer, and the deposited layer of polysilicon is doped.

In some implementations, a first stop layer and a second stop layer are sequentially formed between the substrate and the filling layer.

In some implementations, the first stop layer includes silicon oxide or silicon nitride, the second stop layer includes silicon oxide or polysilicon, and the filling layer includes polysilicon, a high-k dielectric, or a metal.

In some implementations, to form the channel structure, a channel hole extending through the stack structure and the filling layer is formed, stopping at the second stop layer, and the first dielectric layer, the second dielectric layer, the third dielectric layer, and the semiconductor channel are sequentially formed in the channel hole.

In some implementations, to sequentially remove the substrate and the part of the channel structure, the substrate is removed, stopping at the first stop layer, the first stop layer is removed, stopping at the second stop layer, and the second stop layer and the part of the channel structure are removed, stopping at the filling layer.

In some implementations, after locally activating the doped semiconductor layer, a source contact is formed in contact with the doped semiconductor layer.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a stack structure comprising conductive layers and dielectric layers that are interleaved stacked in a vertical direction;
a doped semiconductor layer; and
a channel structure extending through the stack structure and in contact with the doped semiconductor layer, the channel structure comprising a composite dielectric film and a semiconductor channel both extending along the vertical direction, wherein
the composite dielectric film comprises a gate dielectric portion and a memory portion in contact with each other and aligned along the vertical direction,
a part of the gate dielectric portion is located on a lateral side of one of the conductive layers that is closest to the doped semiconductor layer,
the memory portion of the composite dielectric film comprises a blocking layer, a storage layer, and a tunneling layer stacking along the lateral direction,
the gate dielectric portion of the composite dielectric film comprises a first gate dielectric layer, a second gate dielectric layer, and a third gate dielectric layer along the lateral direction,
the blocking layer and the first gate dielectric layer comprise a same dielectric material,
the tunneling layer and the third gate dielectric layer comprise a same dielectric material, and
the storage layer and the second gate dielectric layer comprise different dielectric materials.

2. The 3D memory device of claim 1, wherein the storage layer comprises silicon nitride.

3. The 3D memory device of claim 1, wherein each of the blocking layer, the tunneling layer, and the first and third gate dielectric layers comprises silicon oxide.

4. The 3D memory device of claim 1, wherein the first, second, and third dielectric layers comprise a same dielectric material.

5. The 3D memory device of claim 1, wherein the one of the conductive layers comprises a source select gate line.

6. The 3D memory device of claim 1, wherein
the semiconductor channel comprises a doped portion; and
a part of the doped portion is located on a lateral side of the one of the conductive layers that is closest to the doped semiconductor layer.

7. The 3D memory device of claim 6, wherein the doped portion of the semiconductor channel and the doped semiconductor layer each comprises N-type doped polysilicon.

8. The 3D memory device of claim 1, further comprising a filling layer between the stack structure and the doped semiconductor layer.

9. The 3D memory device of claim 8, wherein the doped semiconductor layer comprises a plate and a plug extending from the plate into the filling layer and in contact with the semiconductor channel.

10. A three-dimensional (3D) memory device, comprising:
a stack structure comprising conductive layers and dielectric layers that are interleaved stacked, wherein the conductive layers comprise one or more source select gate lines and a plurality of word lines; and
a channel structure extending through the stack structure, the channel structure comprising a composite dielectric film and a semiconductor channel along a lateral direction, wherein
the composite dielectric film comprises a gate dielectric portion and a memory portion in contact with each other and aligned along a vertical direction, a part of the gate dielectric portion facing, along the lateral direction, the one or more source select gate lines,
the semiconductor channel comprises a doped portion, a part of the doped portion facing, along the lateral direction, the one or more source select gate lines,
the memory portion of the composite dielectric film comprises a blocking layer, a storage layer, and a tunneling layer stacking along the lateral direction,
the gate dielectric portion of the composite dielectric film comprises a first gate dielectric layer, a second gate dielectric layer, and a third gate dielectric layer along the lateral direction,
the blocking layer and the first gate dielectric layer comprise a same dielectric material,
the tunneling layer and the third gate dielectric layer comprise a same dielectric material, and
the storage layer and the second gate dielectric layer comprise different dielectric materials.

11. A three-dimensional (3D) memory device, comprising:
a stack structure comprising conductive layers and dielectric layers that are interleaved stacked in a vertical direction;
a doped semiconductor layer on the stack structure; and
a channel structure extending through the stack structure in the vertical direction and comprising:
a first-sub channel structure in contact with the doped semiconductor layer and comprising a doped channel layer and a gate dielectric structure laterally surrounding the doped channel layer, and
a second-sub channel structure in contact with the first-sub channel structure and comprising an undoped channel layer and a memory film structure laterally surrounding the undoped channel layer, wherein
the memory film structure comprises a blocking layer, a storage layer, and a tunneling layer stacking along the lateral direction,
the gate dielectric structure comprises a first gate dielectric layer, a second gate dielectric layer, and a third gate dielectric layer along the lateral direction
the blocking layer and the first gate dielectric layer comprise a same dielectric material,
the tunneling layer and the third gate dielectric layer comprise a same dielectric material, and
the storage layer and the second gate dielectric layer comprise different dielectric materials.

12. The 3D memory device of claim 11, wherein
the doped semiconductor layer is aligned with the undoped channel layer along the vertical direction; and
the gate dielectric structure is aligned with the memory film structure along the vertical direction.

13. The 3D memory device of claim 11, wherein the first-sub channel structure is located on a lateral side of one of the conductive layers that is closest to the doped semiconductor layer.

14. The 3D memory device of claim 11, further comprising a filling layer between the stack structure and the doped semiconductor layer.

15. The 3D memory device of claim 14, wherein the doped semiconductor layer comprises
   a plate extending laterally on the filling layer; and
   a plug extending vertically from the plate through the filling layer and in contact with the first-sub channel structure.

16. The 3D memory device of claim 15, wherein the doped channel layer extends vertically into the plug.

* * * * *